(12) United States Patent
Yu et al.

(10) Patent No.: US 7,642,100 B2
(45) Date of Patent: Jan. 5, 2010

(54) METHOD AND SYSTEM FOR YIELD AND PRODUCTIVITY IMPROVEMENTS IN SEMICONDUCTOR PROCESSING

(75) Inventors: Chen-Hua Yu, Hsin-Chu (TW); Lawrance Sheu, Hsinchu (TW); Yi-Li Hsiao, Hsinchu (TW); Francis Ko, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 355 days.

(21) Appl. No.: 11/559,781

(22) Filed: Nov. 14, 2006

(65) Prior Publication Data

US 2008/0064127 A1 Mar. 13, 2008

Related U.S. Application Data

(60) Provisional application No. 60/844,560, filed on Sep. 13, 2006.

(51) Int. Cl.
*H01L 21/66* (2006.01)
(52) U.S. Cl. .......................................... 438/14
(58) Field of Classification Search .................. None
See application file for complete search history.

(56) References Cited

U.S. PATENT DOCUMENTS 6,721,616 B1 * 4/2004 Ryskoski .................... 700/108
7,292,906 B2 * 11/2007 Funk et al. .................. 700/121
7,403,832 B2 * 7/2008 Schulze et al. .............. 700/110

OTHER PUBLICATIONS

Chen et al., "Virtual Metrology: A Solution for Wafer to Wafer Advanced Process Control", 2005 IEEE, pp. 155-157.

* cited by examiner

*Primary Examiner*—Charles D. Garber
*Assistant Examiner*—Andre' C Stevenson
(74) *Attorney, Agent, or Firm*—Duane Morris LLP

(57) ABSTRACT

A semiconductor processing method includes processing a first substrate while detecting at least one first processing parameter value in a first apparatus. The first processing parameter is analyzed, thereby yielding at least one first predicted parameter value. The first predicted parameter value is compared with a first pre-defined parameter value, thereby yielding at least one first comparison result. A first recipe is applied corresponding to the first comparison result for processing a second substrate in the first apparatus.

29 Claims, 17 Drawing Sheets

CONTINUE

CONTINUED

METHOD AND SYSTEM FOR YIELD AND PRODUCTIVITY IMPROVEMENTS IN SEMICONDUCTOR PROCESSING

This application claims the benefit of U.S. Provisional Patent Application No. 60/844,560, filed Sep. 13, 2006, which is expressly incorporated by reference herein in its entirety.

BACKGROUND OF THE INVENTION

1. Field of the Invention

The present invention relates to semiconductor processing methods and systems of using the semiconductor processing methods.

2. Description of the Related Art

With advances associated with electronic products, semiconductor technology has been widely applied in manufacturing memories, central processing units (CPUs), liquid crystal displays (LCDs), light emission diodes (LEDs), laser diodes and other devices or chipsets. In order to achieve high-integration and high-speed goals, dimensions of semiconductor integrated circuits continue to shrink. Various materials and techniques have been proposed to achieve these integration and speed goals and to overcome manufacturing obstacles associated therewith.

In addition, since wafer sizes gradually increase from 6 inch, 8 inch, 12 inch and even to 16 or 18 inch, more dies can be formed on a single wafer. For example, a 12-inch wafer can provide 2.25 times the number of dies formed from an 8-inch wafer. The increasing wafer size, however, results in concerns associated with the ability to maintain uniformity of various characteristics (e.g., thin film thickness, etch rate, resistance or the like) for layers and structures formed over the wafer. Due to the non-uniformity of substrate characteristics, devices, diodes or circuits formed over the same wafer, but at different locations (e.g., central region and peripheral region) may have different electrical characteristics. However, if the electrical characteristics of dies are substantially different from default levels or fall out of pre-defined specifications, the dies are considered failed, and the yield of the substrate declines. Accordingly, uniformity of substrate characteristics has become an issue to be solved in the field.

FIG. 1 is a drawing showing a prior art method of adjusting processing conditions.

Referring to FIG. 1, a tool 100, such as a chemical vapor deposition (CVD) tool is provided. A wafer (not shown) is placed in the CVD tool 100 for forming a thin film layer (not shown) thereover. Step 110 applies a recipe to the tool 100 for processing the wafer. After the formation of the thin film layer, the wafer is transferred to a measuring tool (not shown) in which step 120 is performed. In step 120, the measuring tool measures the thickness of the thin film layer. The thickness of the film layer is then compared with a desired value of the film layer. In step 130, the comparison result is then fed back to step 110 for adjusting the processing conditions for subsequent substrates. If the measured thickness is larger or less than the desired value, processing conditions are adjusted to form thin film layers with the desired value over subsequent wafers.

The prior art method, however, is not time effective. For example, a second wafer must wait for the measured thickness to be collected from the first wafer, such that a film layer with an ideal desired thickness can be formed over the second wafer. In other words, the second wafer or other subsequent wafers cannot be processed until the measured thickness is collected. If every single wafer fabrication process must go through the loop shown in FIG. 1, time is wasted while an immediately subsequent wafer is idle, waiting for the measured thickness retrieved from the last processed wafer.

In addition, the tool 100 cannot dynamically adjust the processing conditions for providing uniform substrate characteristics. For example, gas or plasma for forming a film layer is uniformly distributed over the wafer. If it is found that non-uniformity of substrate characteristics occurs in the wafer, the electrode or plate that uniformly provides gas or plasma is disassembled and another electrode or plate is substituted that provides a distribution profile corresponding to the measured non-uniform thickness. However, if another measured non-uniformity is collected, another electrode or distribution plate corresponding thereto should be assembled to the tool 100. Not only is the tool 100 unable to dynamically respond to the changing non-uniform profiles, but also disassembling and assembling different electrodes or gas distribution plates increase processing time.

From the foregoing, a method for processing wafers and systems for performing the methods are desired.

SUMMARY OF THE INVENTION

In accordance with some exemplary embodiments, a semiconductor processing method includes processing a first substrate while detecting at least one first processing parameter value of a first processing parameter in a first apparatus. The first processing parameter is analyzed, thereby yielding at least one first predicted parameter value. The first predicted parameter value is compared with a first pre-defined parameter value, thereby yielding at least one first comparison result. A first recipe is applied corresponding to the first comparison result for processing a second substrate in the first apparatus.

In accordance with some exemplary embodiments, a semiconductor processing system comprises a first apparatus and at least one first processor coupled to the first apparatus. The first apparatus is configured to process a first substrate while detecting at least one first processing parameter value of a first processing parameter. The first processor is configured to analyze the first processing parameter, thereby yielding at least one first predicted parameter value; to compare the first predicted parameter value with a first pre-defined parameter value, thereby yielding at least one first comparison result; and to apply a first recipe corresponding to the first comparison result for processing a second substrate in the first apparatus.

The above and other features of the present invention will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

DESCRIPTION OF THE PREFERRED EMBODIMENT

Figure 1:
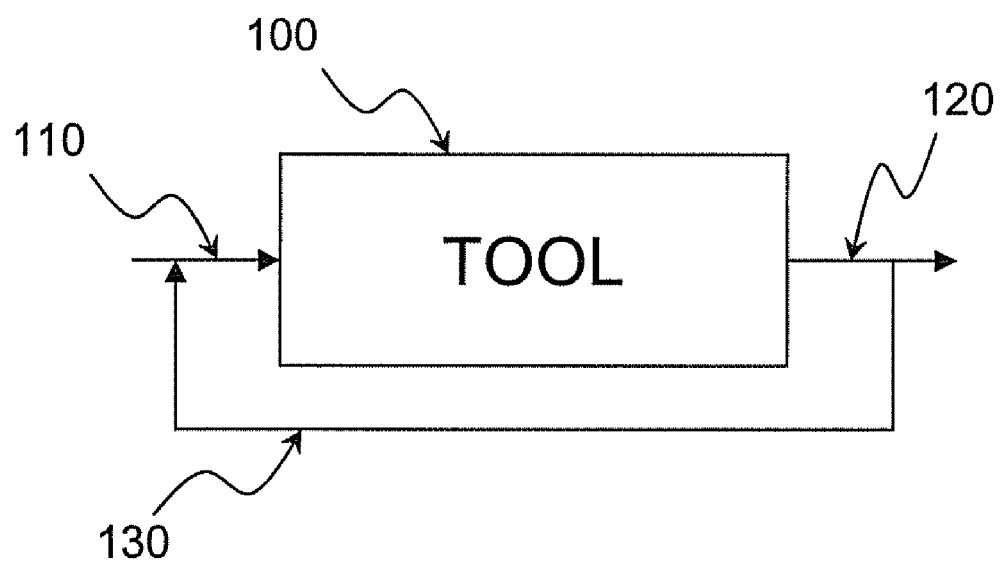
FIG. 1 is a drawing showing a prior art method of adjusting processing conditions.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Figure 2A:
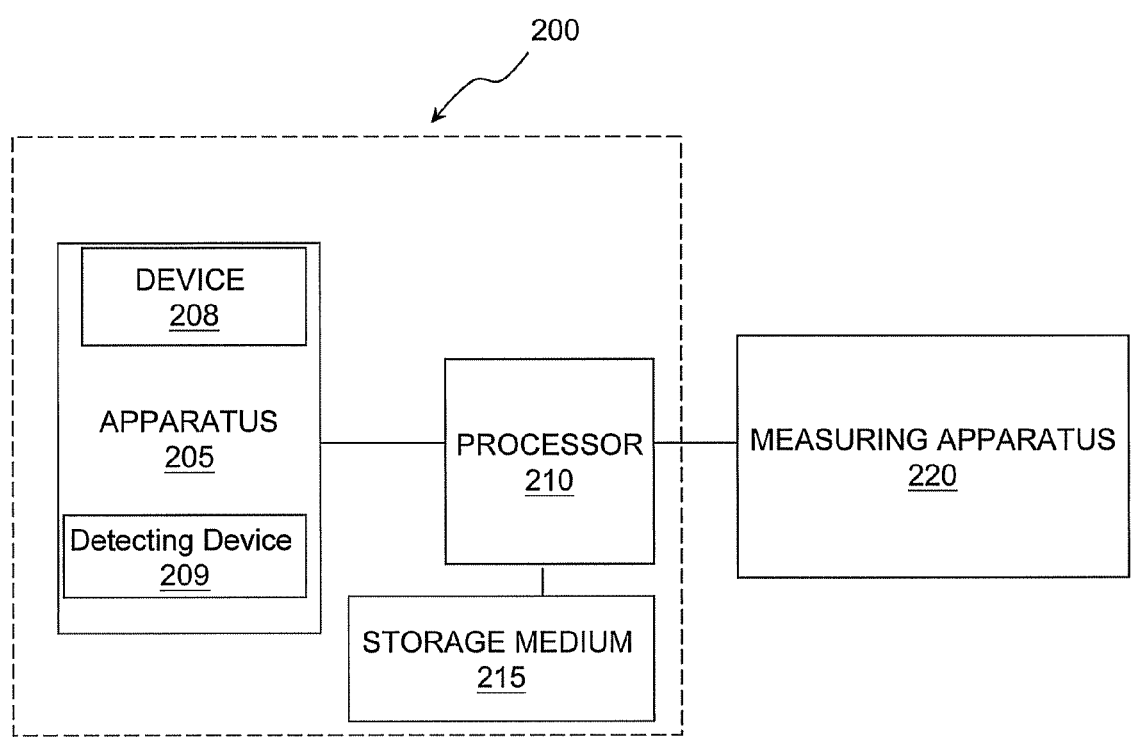
FIG. 2A is a schematic drawing showing an exemplary semiconductor processing system.

FIG. 2A is a schematic drawing showing an exemplary semiconductor processing system. The processing system 200 may comprise an apparatus 205 and a processor 210 coupled thereto. The apparatus 205 may comprise an etch apparatus, photolithographic apparatus, thin film apparatus (e.g., furnace, chemical vapor deposition (CVD), physical vapor deposition (PVD), electrochemical plating apparatus, electroless plating apparatus, or the like), implantation apparatus, thermal processing apparatus, cleaning apparatus, chemical mechanical planarization (CMP) tool, combinations thereof or the like. In some embodiments, the apparatus 205 may comprise a device 208 capable of altering at least one processing condition (e.g., processing temperature, type of a processing gas, flow rate of the gas, pressure, voltage, current, radio frequency (RF) power, power, implantation energy, implantation dosage, photolithographic exposure energy, photolithographic exposure time, photoresist spin rate, chemical mechanical planarization (CMP) erosion or erosive rate and CMP downward force, to a substrate so as to achieve a desired uniformity of one processed results of the substrate. In other words, the device 208 may distribute different levels or amounts of gas or processing conditions at different locations of the substrate. The device 208 may comprise, for example, an adjustable electrode, a gas distribution apparatus, a CMP pad or the like. In some embodiments, the device 208 may be of a type described in, for example, commonly assigned and copending U.S. patent application Ser. No. 11/335,455, filed on Jan. 19, 2006, the entirety of which is hereby incorporated by reference herein.

The processor 210 is configured to perform at least one step of analyzing various processing parameters and measurement parameters, comparing various measurement parameters with pre-defined parameter values, comparing various predicted parameter values with pre-defined parameter values, comparing various processing parameters and pre-defined parameter values, or the like. The processor 210 may comprise, for example, at least one of a digital signal processor (DSP), microprocessor, computer, combinations thereof or the like. In some embodiments, the processor 210 is further configured to apply a recipe corresponding to comparison result for processing substrates. Detailed descriptions are provided below.

Referring again to FIG. 2A, the processing system 200 may further comprise at least one storage medium 215 coupled to the processor 210. The storage medium 215 may comprise, for example, at least one of a random access memory (RAM), floppy diskettes, read only memories (ROMs), flash drive, CD-ROMs, DVD-ROMs, hard drives, high density (e.g., "ZIP™") removable disks or any other computer-readable storage medium. The storage medium 215 may be configured to store processing parameters, measurement parameters, processing results, comparison results, processing recipes, pre-defined parameters, combinations thereof or the like.

In some embodiments, the processing system 200 is coupled to a measuring apparatus 220. The measuring apparatus 220 is coupled to the processor 210 for measuring physical or electrical characteristics, e.g., width, length, depth, diameter, thickness, resistance, sheet resistance, refractive index, dielectric constant, hardness, elasticity, area, space, and therefore capable of calculating the uniformity of the characteristics. In some embodiments, the measuring apparatus 220 is integrated or embedded in the processing system to efficiently process and collect parameters from substrates.

Figure 2B:
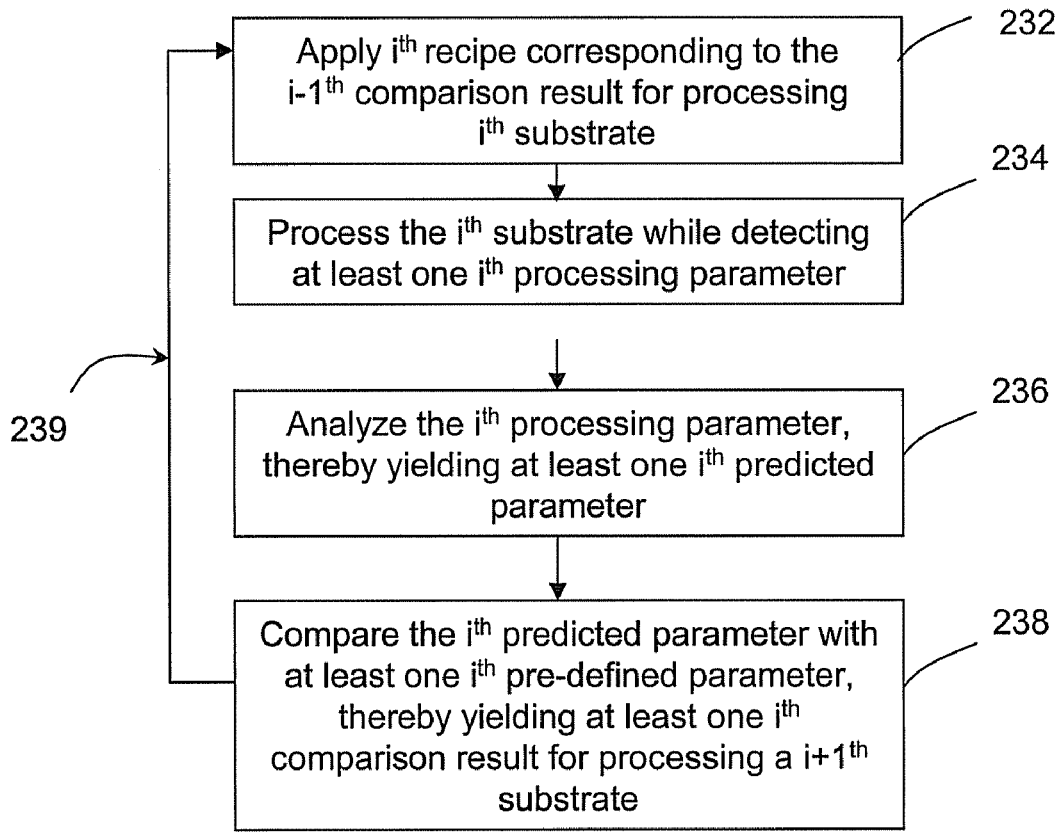
FIG. 2B is a schematic drawing showing a processing loop of an exemplary semiconductor processing method in a single apparatus.

FIG. 2B is a flow chart showing a processing loop of an exemplary semiconductor processing method in a single apparatus. In FIG. 2B, the processing loop shows exemplary steps for processing an i$^{th}$ substrate in order to generate parameter conditions in response to an i+1$^{th}$ recipe for processing an i+1$^{th}$ substrate. In some embodiments, a number i−1 of substrates have been processed before the i$^{th}$ substrate is processed. After the i−1$^{th}$ substrate is processed, the i−1$^{th}$ comparison result may be generated by the processor 210 (shown in FIG. 2A) and fed back to a recipe applying step 232. The substrates can be a silicon substrate, III-V compound substrate, display substrate such as a liquid crystal display (LCD), plasma display, electro luminescence (EL) lamp display, or light emitting diode (LED) substrate, for example.

Referring again to FIG. 2B, in step 232 the processor 210 may apply the i$^{th}$ recipe corresponding to the i−1$^{th}$ comparison result. The i−1$^{th}$ comparison result comes from parameters of the i−1$^{th}$ substrate. In some embodiments, the recipe applying step 232 may comprise selecting a recipe corresponding to the i−1$^{th}$ comparison result from a plurality of recipes or a recipe selection table (RST). The i$^{th}$ recipe is selected such that processing parameters of the i$^{th}$ recipe can process the i$^{th}$ substrate in order to generate at least one substrate characteristic with a desired uniformity. In one example, the system 200 comprises a thin film deposition (e.g., a CVD) chamber. The processor 210 applies the $i^{th}$ recipe for depositing a thin film (not shown), such as oxide layer, nitride layer, oxynitride layer, combinations thereof or the like, over the $i^{th}$ substrate. For depositing the thin film layer over the $i^{th}$ substrate, the processor 210 generates at least one signal corresponding to the $i^{th}$ recipe to the apparatus 205 in order to deposit the thin film layer with at least one desired substrate characteristic over the $i^{th}$ substrate.

In step 234, the apparatus 205 (shown in FIG. 2A) may use the $i^{th}$ recipe for processing the $i^{th}$ substrate while detecting at least one $i^{th}$ processing parameter. The processing parameter may comprise, for example, a parameter value distribution of at least one of a processing temperature, type of a gas, flow rate of the gas, pressure, voltage, current, radio frequency (RF) power, power, implantation energy, implantation dosage, photolithographic exposure energy, photolithographic exposure time, photoresist spin rate, chemical mechanical planarization (CMP) erosion or erosive rate and CMP downward force. To detect the parameters, the apparatus 205 (shown in FIG. 2A) may comprise at least one detecting device 209, such as a plurality of sensors, detectors, pressure gauges, flow rate gauges, voltage meters, current meters, power gauges, rotational meter, combinations thereof or the like. For embodiments forming a thin film layer, the processing parameter may comprise, for example, a parameter distribution of at least one of the type of gas, flow rate of the gas, pressure, processing time, voltage, power, combinations thereof or the like.

As described above in connection with FIG. 2A, the device 208 may provide, for example, a different amount of gas at different regions of the $i^{th}$ substrate. Accordingly, the device 208 can provide a desired uniformity, e.g., thickness, of the thin film layer over the $i^{th}$ substrate by providing different amounts of gas over different regions of the $i^{th}$ substrate.

In step 236, the processor 210 may process the $i^{th}$ processing parameter, thereby yielding at least one $i^{th}$ predicted parameter. The predicted parameter may comprise, for example, predicted physical or electrical characteristics (e.g., width, length, depth, diameter, thickness, resistance, sheet resistance, refractive index, dielectric constant, hardness, elasticity, area, space, and uniformity of the characteristics. For embodiments forming a thin film layer, the predicted parameters may comprise, for example, a predicted thickness and uniformity of the thickness cross the substrate. The predicted parameter may be generated by at least one methodology, e.g., modeling software, simulation software or virtual metrology technology.

In step 238, the processor 210 compares the $i^{th}$ predicted parameter with at least one $i^{th}$ pre-defined parameter, thereby yielding at least one $i^{th}$ comparison result for processing the $i+1^{th}$ substrate. The pre-defined parameter may comprise, for example, physical or electrical characteristics, e.g., width, length, depth, diameter, thickness, resistance, sheet resistance, refractive index, dielectric constant, hardness, elasticity, area, space, and uniformity of the characteristics. For embodiments forming a thin film layer, the pre-defined parameter may comprise a thickness and its uniformity, for example.

The predicted thickness and the pre-defined thickness are compared by the processor 210, for example. In step 238, the processor 210 may generate a comparison result 239, e.g., a thickness difference. The comparison result 239 is then fed back to the applying step 232, in which an $i+1^{th}$ recipe comprising at least one $i+1^{th}$ processing parameter is applied for processing the subsequent $i+1^{th}$ substrate. In view of the embodiments, the $i^{th}$ processing parameter can be retrieved while the $i^{th}$ substrate is being processed in step 234 or 236. The retrieved $i^{th}$ processing parameter is then processed in step 236 for generating the $i^{th}$ predicted parameter. The comparison result 239 of the $i^{th}$ predicted parameter and the $i^{th}$ pre-defined parameter is then fed back for processing the $i+1^{th}$ substrate. In other words, the $i+1^{th}$ recipe can be ready for processing the $i+1^{th}$ substrate before the complete of processing the $i^{th}$ substrate in step 234. Accordingly, processing the $i+1^{th}$ recipe does not need to wait for actual measurement parameters of the $i^{th}$ substrate for obtaining the $i^{th}$ comparison result. The process cycle time can thus be reduced and a desired adjustment of processing conditions for the subsequent substrate can be achieved.

Further, the comparison result 239 generated by step 238 may cooperate with the device 208 (shown in FIG. 2A) to further provide a desired characteristic uniformity over the $i+1^{th}$ substrate. For example, if the comparison result 239 generated in step 238 indicates that the $i^{th}$ substrate has a thick portion at the central region and a thin portion at the peripheral region, the processor 210 (shown in FIG. 2A) may apply the $i+1^{th}$ recipe, which will adjust, for example, amounts of gas provided through the device 208 in different regions over the $i+1^{th}$ substrate such that a substantially uniform film layer will be formed over the $i+1^{th}$ substrate.

Figure 2C:
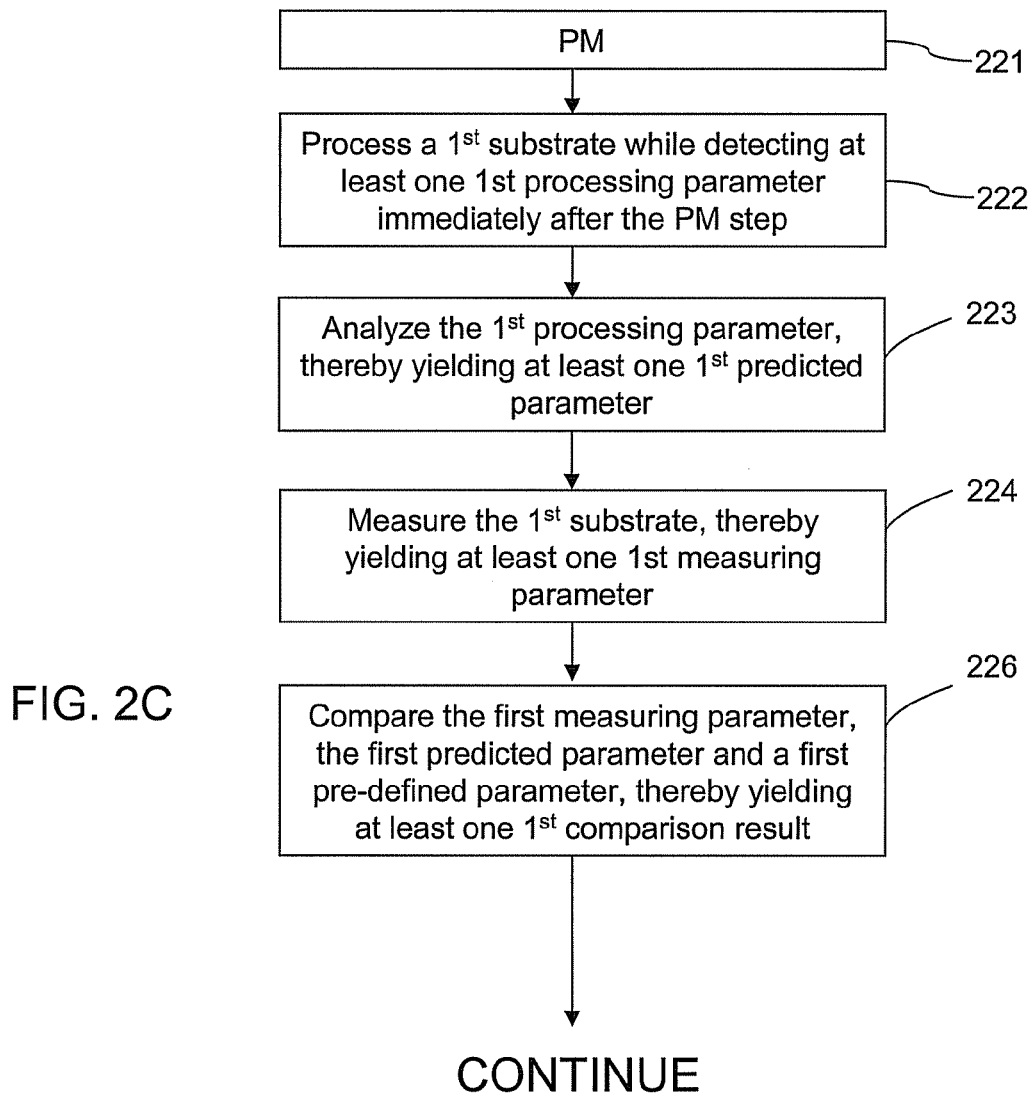
FIG. 2C is a schematic flowchart showing an exemplary semiconductor processing method immediately after a preventive maintenance (PM) step.
Figure 2C:
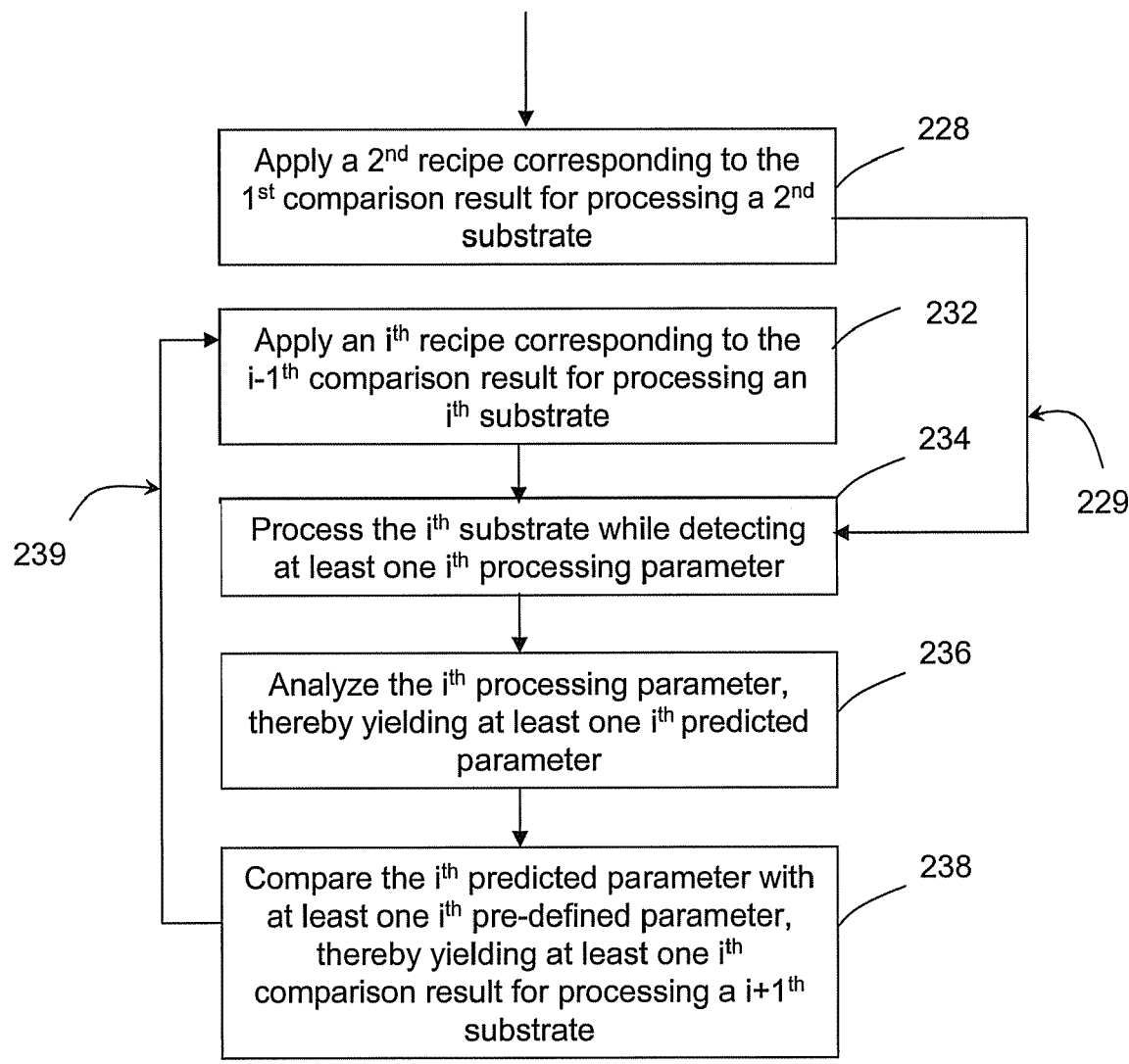

FIG. 2C is a schematic flowchart showing an exemplary semiconductor processing method immediately after a preventive maintenance (PM) step.

Steps 222, 223, 226, 228, 232, 234, 236 and 238 may be performed by the system 200 set forth above in connection with FIG. 2A. Step 224 is performed by the measuring apparatus 220 (shown in FIG. 2A).

Step 221 represents a PM step. The PM step 221 may occur after a regular shutdown, periodic shutdown, mis-operation or in any situation for which adjustments of the apparatus 205 shown in FIG. 2A is needed. For embodiments forming a thin film layer, after the PM step 221 the apparatus 205 should provide a film layer with a desired uniform film layer over a substrate. In other embodiments, the PM step 210 does not provide a desired characteristic, and other adjustments of the apparatus 205 may be needed.

After the PM step 221 of the apparatus 205, step 222 may process the first substrate in the apparatus 205. In some embodiments, since the first substrate is processed immediately after the PM step 221, no comparison result provided from a last substrate is available for processing the first substrate. Accordingly, the first substrate may be processed based on a default processing parameter which may be intended to form the thin film layer with a desired thickness and thickness uniformity.

In some embodiments, step 223 may analyze the processing parameter value detected by step 222, thereby yielding at least one first predicted parameter. The first predicted parameter may be, for example, predicted physical or electrical characteristics (such as, width, length, depth, diameter, thickness, resistance, sheet resistance, refractive index, dielectric constant, hardness, elasticity, area, space, and uniformity thereof. For embodiments forming a thin film layer, the first predicted parameter may be the predicted thickness and thickness uniformity of the thin film layer formed over the first substrate, for example.

In step 224, at least one substrate characteristic of the processed first substrate is collected by the measuring apparatus 220 (shown in FIG. 2A), thereby yielding at least one first measurement parameter. The first measurement parameter may include, for example, physical or electrical characteristics such as, width, length, depth, diameter, thickness, resistance, sheet resistance, refractive index, dielectric constant, hardness, elasticity, area, space, and uniformity of the characteristics. For embodiments forming a thin film layer, the first measurement parameter may comprise the thickness and thickness uniformity of the thin film layer formed over the first substrate, for example.

In step 226, the processor 210 may compare the first measurement parameter value, the first predicted parameter value or at least one pre-defined parameter value, thereby yielding at least one first comparison result 229. The first pre-defined parameter may comprise, for example, physical or electrical characteristics such as, width, length, depth, diameter, thickness, resistance, sheet resistance, refractive index, dielectric constant, hardness, elasticity, area, space, and uniformity of the characteristics. For embodiments forming a thin film layer, the first pre-defined parameter may comprise, for example, a pre-defined thickness and uniformity of the thin film layer. In addition, the comparison result 229 may comprise a thickness difference and a uniformity difference of the first thin film layer.

In step 228, the processor 210 may apply a second recipe corresponding to the first comparison result for processing a subsequent second substrate. For example, if the comparison result 229 generated in step 228 indicates that the first thin film layer formed over the first substrate has a thick portion at the central region and a thin portion at the peripheral region, the processor 210 (shown in FIG. 2A) may apply the second recipe, which will adjust, for example, amounts of gas provided through the device 208 over the second substrate such that a desired uniform film layer will be formed over the second substrate.

After step 228, the apparatus 205 in response to the second recipe processes the second substrate with at least one second processing parameter in step 234. Therefore, the loop shown in FIG. 2C, i.e., the loop shown in FIG. 2B, is performed for generating comparison results for processing the third and subsequent substrates.

Figure 2D:
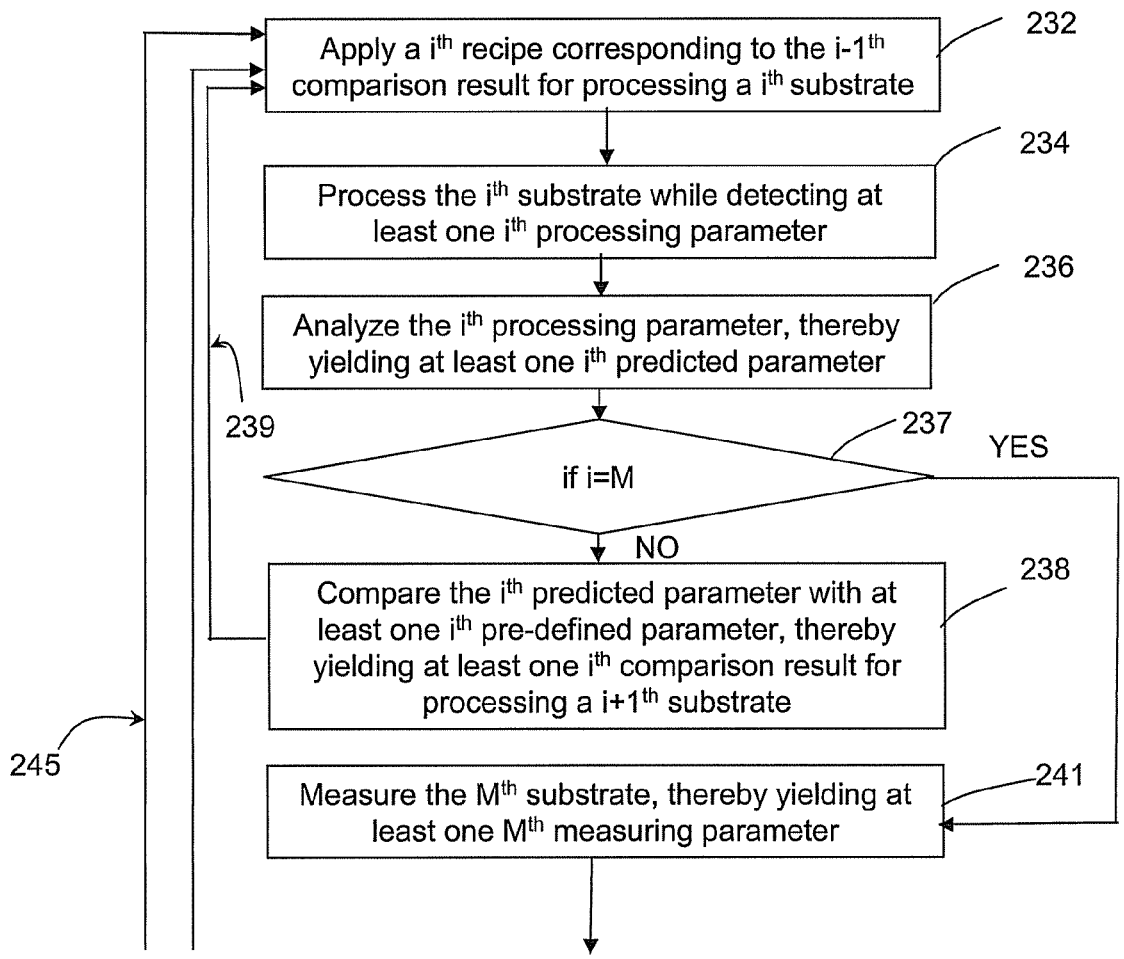
FIG. 2D is a schematic flowchart showing an exemplary semiconductor processing method for adjusting processing conditions with at least one measurement parameter.
Figure 2D:
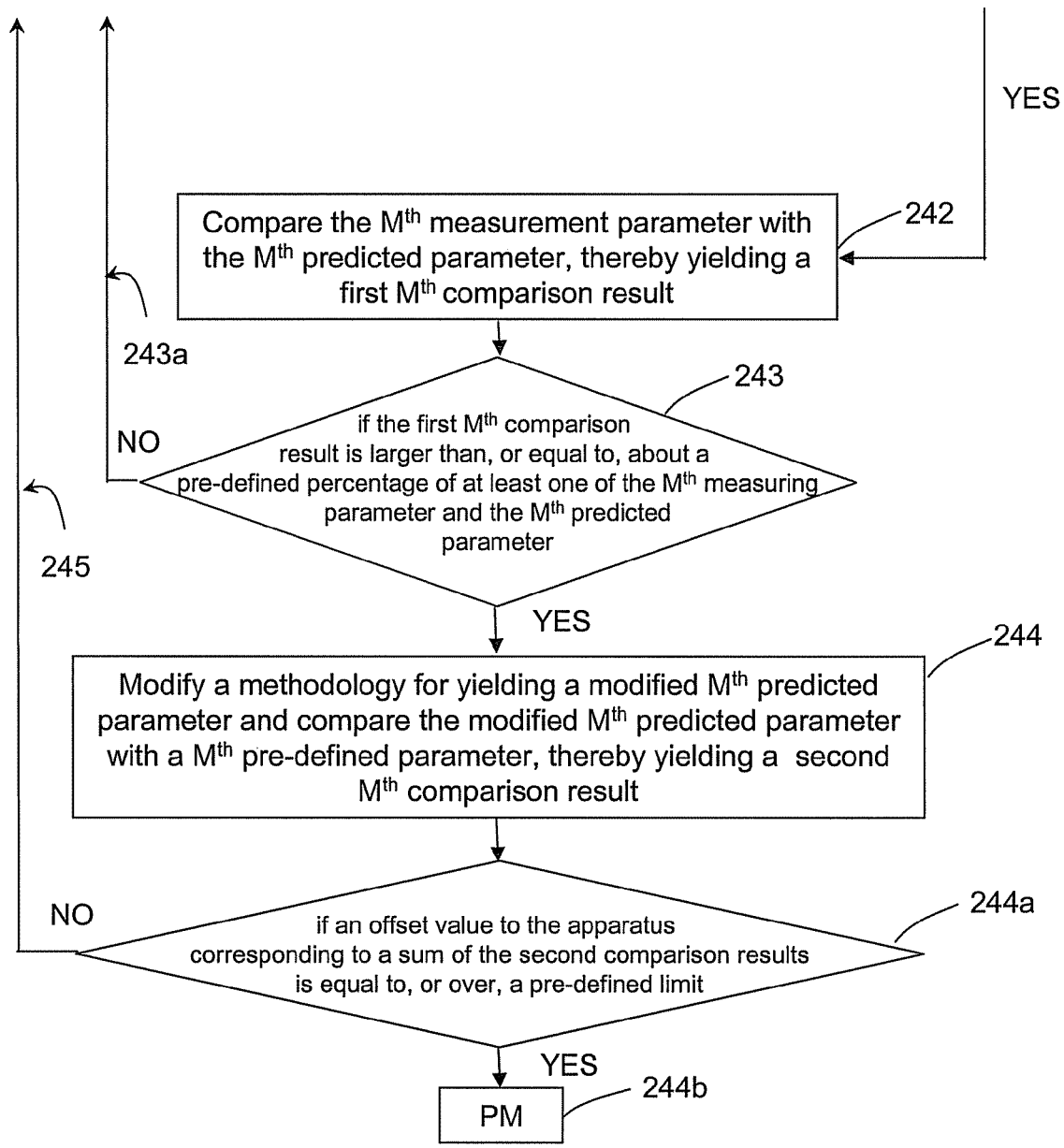

FIG. 2D is a schematic flow chart showing an exemplary semiconductor processing method for adjusting processing conditions with at least one measurement parameter.

Referring again to FIG. 2B, since the substrates are processed in accordance with the comparison results 239 yielded from comparison between the predicted parameters and the pre-defined parameters, no actual measurement parameter is applied thereto. For example, in some embodiments forming thin film layers, the pre-defined parameters of the substrates may be a default or fixed thickness. If the processing parameter detected while the $i^{th}$ substrate is subjected to the deposition process generates the predicted parameter that substantially matches the pre-defined parameter in step 238, the subsequent processing parameters also become fixed. Without actually monitoring the apparatus 205 and/or the characteristics of the film layer formed over the substrates, the comparison results 239 from the predicted parameters may not really reflect the conditions of the apparatus 205 and/or the film layer thickness or uniformity over the substrates. Accordingly, subsequent substrates processed by the fixed processing parameters may not provide desired physical or electrical characteristics of the film layer. To avoid this situation, in some embodiments a checking step is added.

Referring to FIG. 2D, step 237 is added between processing steps 236 and 238. "M" represents a number of substrates that are processed by the apparatus 205 between two consecutive checking steps. In other words, "M" also represents the $M^{th}$ substrate that is processed by the apparatus 205. For example, "M" can be at least one of 120 (5 lots of wafers), 240 (10 lots of wafers), 360, . . . , 120×, combinations thereof or the like. In some embodiments, "M" is selected in accordance with a processing history which may be stored in the storage medium 215 (shown in FIG. 2A). For example, the processing history of the apparatus 205 may indicate the trend of the processing conditions of the apparatus 205, such that a number of substrates that is processed by the apparatus 205 between measurements does not result in the conditions of the apparatus 205 rising over or falling below undesired specifications. It is noted that the setting of "M" may vary in accordance with the type of the apparatus 205 and/or the process performed therein. One of ordinary skill in the art, after reading this disclosure, can readily adjust or select a desired number "M" for checking the apparatus 205 and/or the characteristics of the processed substrates.

As shown in FIG. 2D, if i is not equal to M, step 238 is performed and the processing loop set forth above in connection with FIG. 2B is kept running. If i is equal to M, the $M^{th}$ substrate is delivered to the measuring apparatus 220 (shown in FIG. 2A) for collecting physical and/or electrical characteristics of thereof, thereby yielding at least one $M^{th}$ measurement parameter in step 241. The $M^{th}$ measurement parameter is the same as, or similar to, the measurement parameter set forth above in connection with FIG. 2A.

In step 242, the processor 210 may compare the $M^{th}$ measurement parameter value and the $M^{th}$ predicted parameter value, thereby yielding a first $M^{th}$ comparison result. The first $M^{th}$ comparison result provides information with respect to the deviation of the predicted parameter value from the actual measurement parameter value. The information may be feedback to modify the methodology, e.g., a virtual metrology or a simulation software (not shown) described above in connection with FIG. 2A.

In step 243, the processor 210 may determine whether the first $M^{th}$ comparison result is larger than, or equal to, about a pre-defined percentage (e.g., 1%) of the higher of the first $M^{th}$ measurement parameter value and the $M^{th}$ predicted parameter value. If not so, the simulation software is not modified. The first $M^{th}$ comparison result 243a is then sent back to the step 232 for processing the $M+1^{th}$, i.e., $i+1^{th}$, substrate. However, if the first $M^{th}$ comparison result is about pre-defined percentage (e.g., 1%) or more of the higher of the first $M^{th}$ measurement parameter value and the first $M^{th}$ predicted parameter value, the methodology (not shown) is modified as shown in step 244.

In step 244, the processor 210 may modify the methodology, e.g., a software, for yielding a modified $M^{th}$ predicted parameter value and compared the modified $M^{th}$ predicted parameter with a $M^{th}$ pre-defined parameter, thereby yielding a second $M^{th}$ comparison result. For example, the apparatus 205 comprises a CVD chamber. The $M^{th}$ predicted parameter value is a thickness of about 5,000 Å and the $M^{th}$ measurement parameter value is a thickness of about 4,950 Å. Accordingly, the first $M^{th}$ comparison result reveals a difference of about 50 Å, which is more than 10% of the higher of the both, i.e., $M^{th}$ predicted parameter value. In step 244, the processor 210 may then modify the simulation software, e.g., a reference table, in which various processing parameters (e.g., deposition rate, temperature, pressure, power, gas, gas flow rate, combinations thereof or the like) and corresponding thickness values are provided. The processor 210 may modify the corresponding thickness values and reprocess the $M^{th}$ processing parameter detected in step 234 so that the modified $M^{th}$ predicted parameter is substantially equal to the $M^{th}$ measurement parameter. In other words, the modification of the methodology can desirably monitor the condition of the apparatus 205 (shown in FIG. 2A).

In step 244, the processor 210 may also compare the modified $M^{th}$ predicted parameter with a $M^{th}$ pre-defined parameter, thereby yielding a second $M^{th}$ comparison result. Since the modified $M^{th}$ predicted parameter value is generated from the modified methodology, the modified $M^{th}$ predicted parameter value reflects a actual measurement value. In other words, the second $M^{th}$ comparison result 245 reflects the actual deviation of the $M^{th}$ measurement parameter from the $M^{th}$ pre-defined parameter. Accordingly, even if the comparison results 239 generated in step 238 do not desirably reflect the actual conditions of the apparatus 205 and/or the characteristics of the substrates, steps 237, 241-244 provide a desired modification to the methodology such that a desired $M+1^{th}$, i.e., $i+1^{th}$, recipe corresponding to at least one $M+1^{th}$ processing parameter can be applied to the subsequent $M+1^{th}$ substrate in step 232.

In step 244a, the processor 210 may determine if an offset value, e.g., adjustment or modification, to the apparatus 205 (shown in FIG. 2A) corresponding to a sum of the second comparison results is equal to, or over, a pre-defined limit. If yes, a PM step 244b is performed. If no, the $M^{th}$ comparison result 245 is fed back to step 232 for processing a subsequent substrate. The pre-defined limit may correspond to, for example, an upper critical level (UCL) and a lower critical level (LCL) set forth below in connection with FIG. 2F.

As described above in step 244, the comparison result 245 is provided to be fed back for adjusting or modifying the apparatus 205 so that the adjusted apparatus 205 can process the subsequent substrate, generate a desired uniformity over the substrate. However, the adjustment to the apparatus 205 is advantageously limited. For example, a dielectric layer formed over a plurality of substrates by the apparatus 205, the parameter that affects the thickness uniformity of substrates is the distance between the top electrode of the apparatus 205 and the substrate, for example. Steps 243 and 244 may modify the methodology for every 120-substrate processing period, and the distance between the top electrode of the apparatus 205 and the substrate is also adjusted corresponding to the modification of the methodology. In some embodiments, after several modifications of the distance corresponding to the multiple monitoring of the apparatus 205, the top electrode of the apparatus 205 may be adjusted so close to the substrate that the top electrode of the apparatus 205 may damage the substrate. Accordingly, step 244a provides a safe monitoring such that a total adjustment to the apparatus 205 is not over a pre-defined limit.

Figure 2E:
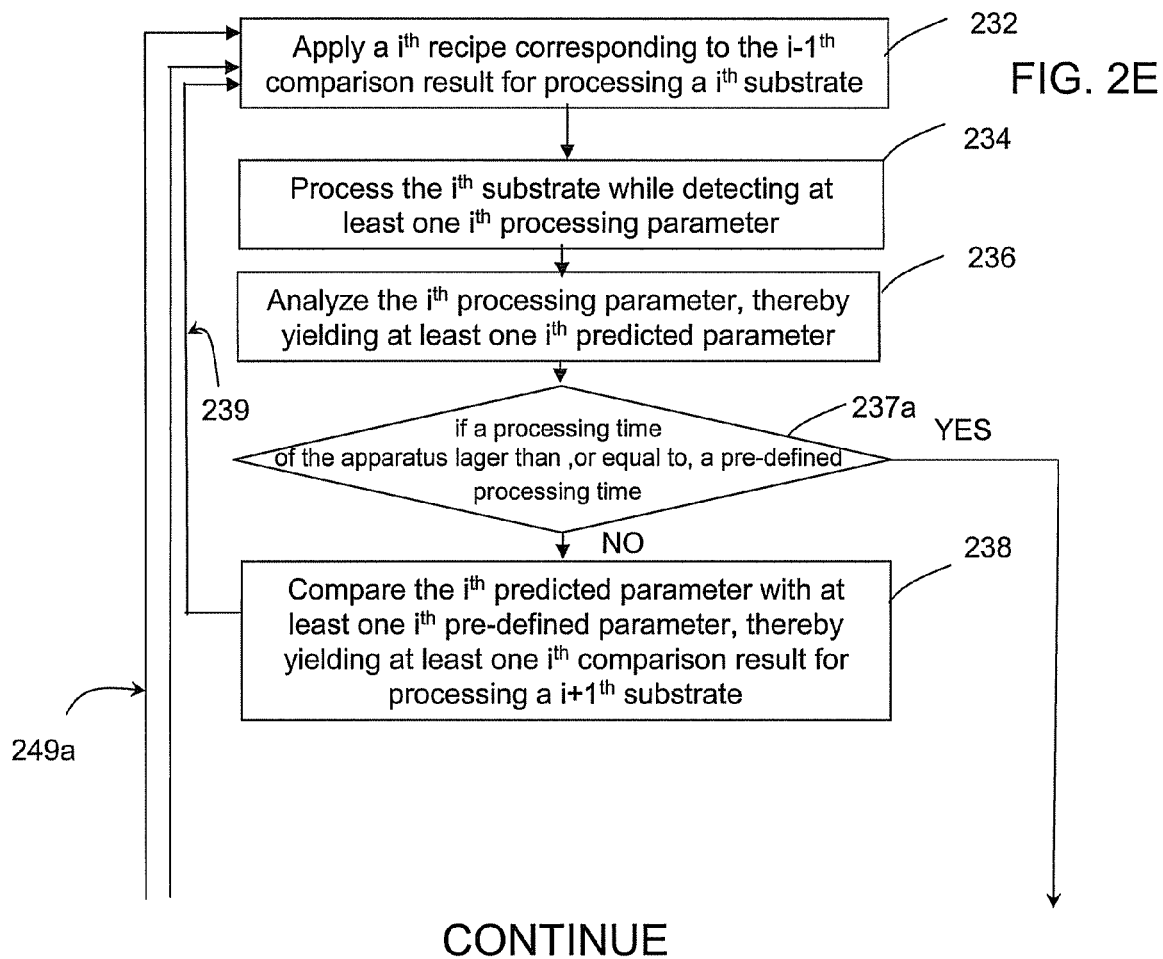
FIG. 2E is a schematic flowchart showing another exemplary semiconductor processing method for adjusting processing conditions with at least one measurement parameter.
Figure 2E:
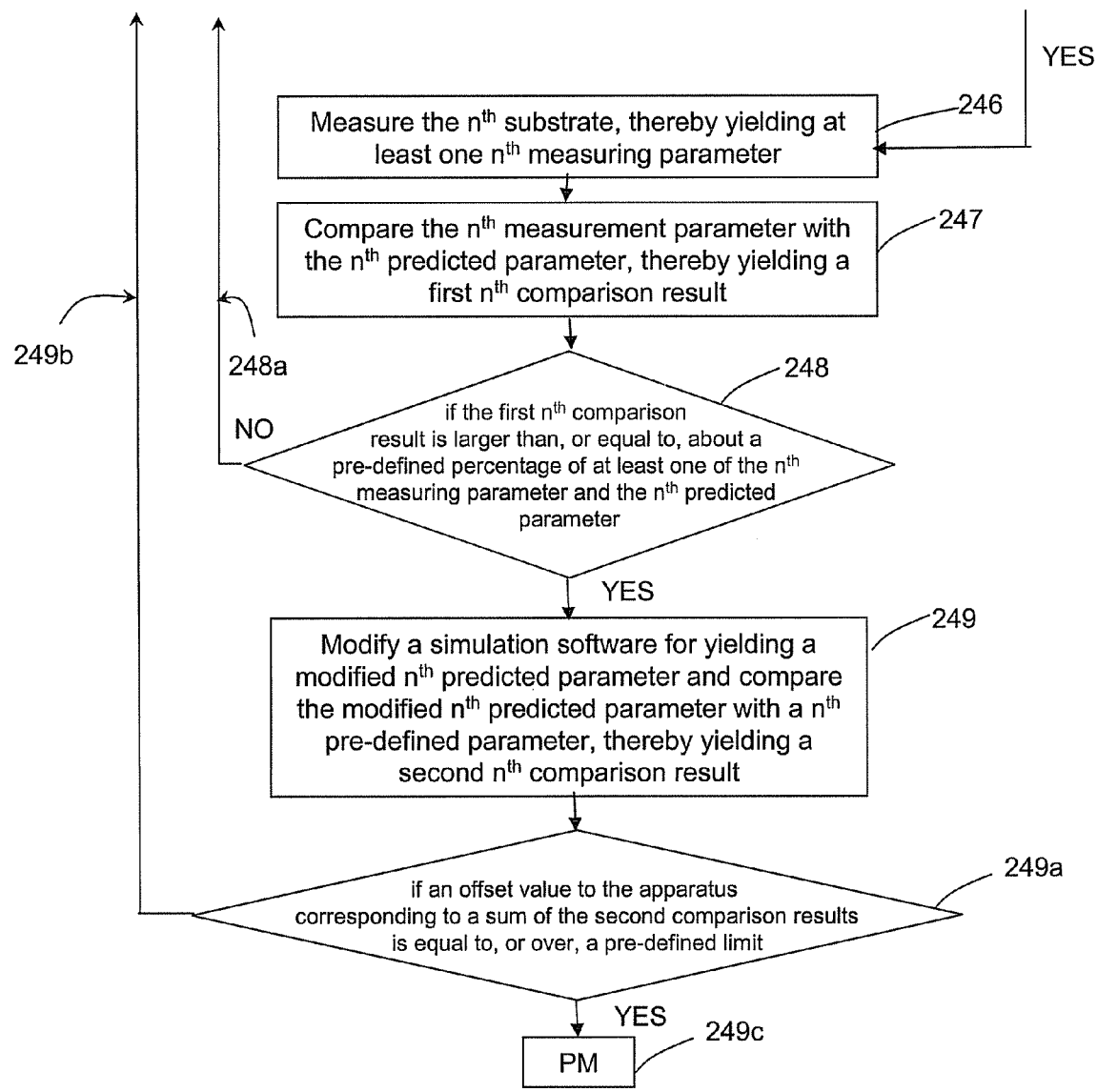

FIG. 2E is a schematic flowchart showing another exemplary semiconductor processing method for adjusting processing conditions with at least one measurement parameters.

In these embodiments, steps 246-249a and 249c are similar to steps 241-244a, and 244b, respectively. Comparison results 248a and 249b are similar to the comparison results 243a and 245, respectively. In step 237a, the processor 210 (shown in FIG. 2A) may determine if the processing time of the apparatus 205 is larger than, or equal to, a pre-defined processing time. If not, step 238 is processed as described above. If the processing time is larger than, or equal to, the pre-defined processing time, steps 246-249a and 249c are performed, and the first and second nth comparison result 248a and 249b, respectively, are used to apply the nth recipe for processing the $n+1^{th}$ substrate. For some embodiments, the processing time is measured after the PM step set forth above in connection with FIG. 2C. The unit of processing time may comprise, for example, second, minute, day, week, month, combinations thereof or the like.

Figure 2F:
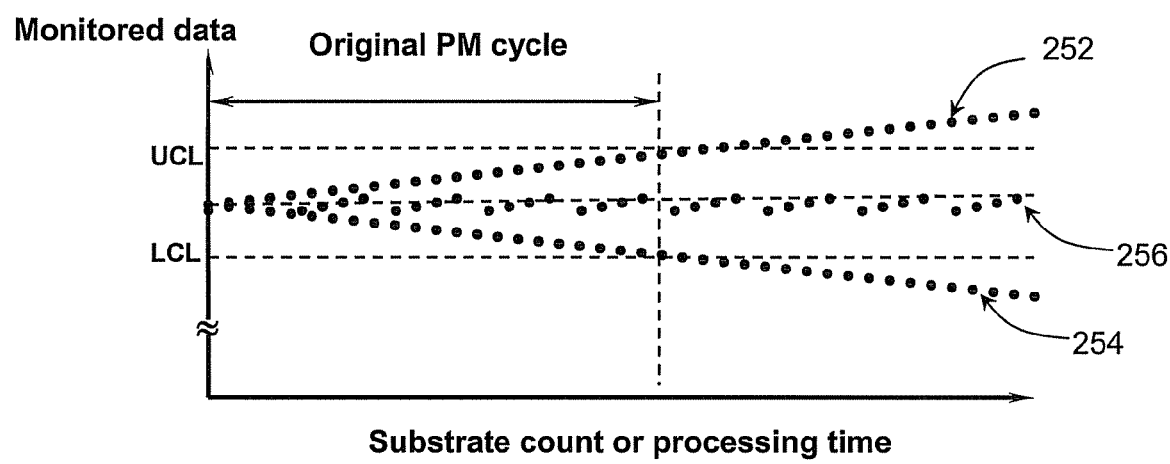
FIG. 2F is a schematic drawing showing trends of apparatus conditions adjusted by the exemplary methods described in connection with FIG. 2A-2E and trends of apparatus conditions adjusted by a traditional method.

FIG. 2F is a schematic drawing showing trends of apparatus conditions adjusted by the exemplary methods described in connection with FIGS. 2A-2E and trends of apparatus conditions adjusted by a traditional method.

Referring to FIG. 2F, dotted lines 252 and 254 represent trends of substrate characteristics by a continuous process by a traditional method in a single tool. Dotted lines 256 represent trends of characteristics by an exemplary adjusting method as described above. The coordinate system (not labeled) comprises a horizontal axis indicating "substrate count or processing time" and a vertical axis indicating "monitored data." The substrate count and processing time correspond to the numeral "M" shown in FIG. 2D and the processing time shown in FIG. 2E, respectively. An upper critical level (UCL) and a lower critical level (LCL) represent desired levels of substrate characteristics. Traditionally, a PM step or a PM cycle is applied to an apparatus before the trends 252 and 254 reach the UCL and LCL, respectively. Since no adjustment of apparatus conditions is provided, a PM step or PM cycle must be applied by the end of a fixed period of time. Unlike the traditional trends 252 and 254, the exemplary methods set forth above in connection with FIGS. 2A-2E provides intermediate corrections between the UCL and LCL. Each segment of the trend 256 corresponds to the apparatus adjustment performed by steps 235, 235a, 242, 244, 246 and 246 described in connection with FIGS. 2D and 2E. With the adjusting steps, apparatus conditions and/or substrate characteristics can be desirably adjusted at the beginning of each segment. In other words, the apparatus conditions and/or substrate characteristics are adjusted back to the conditions of the first substrate of each segment. Therefore, the PM cycle of the exemplary methods described above can be extended and longer than the traditional PM cycle.

In some embodiments as set forth above in connection with FIG. 2D, when the adjustment or modification to the apparatus 205 is equal to, or over, a pre-defined limit, the PM step 249 is provided to modify the apparatus 205 such that the apparatus 205 can be desirably operated.

Figure 3A:
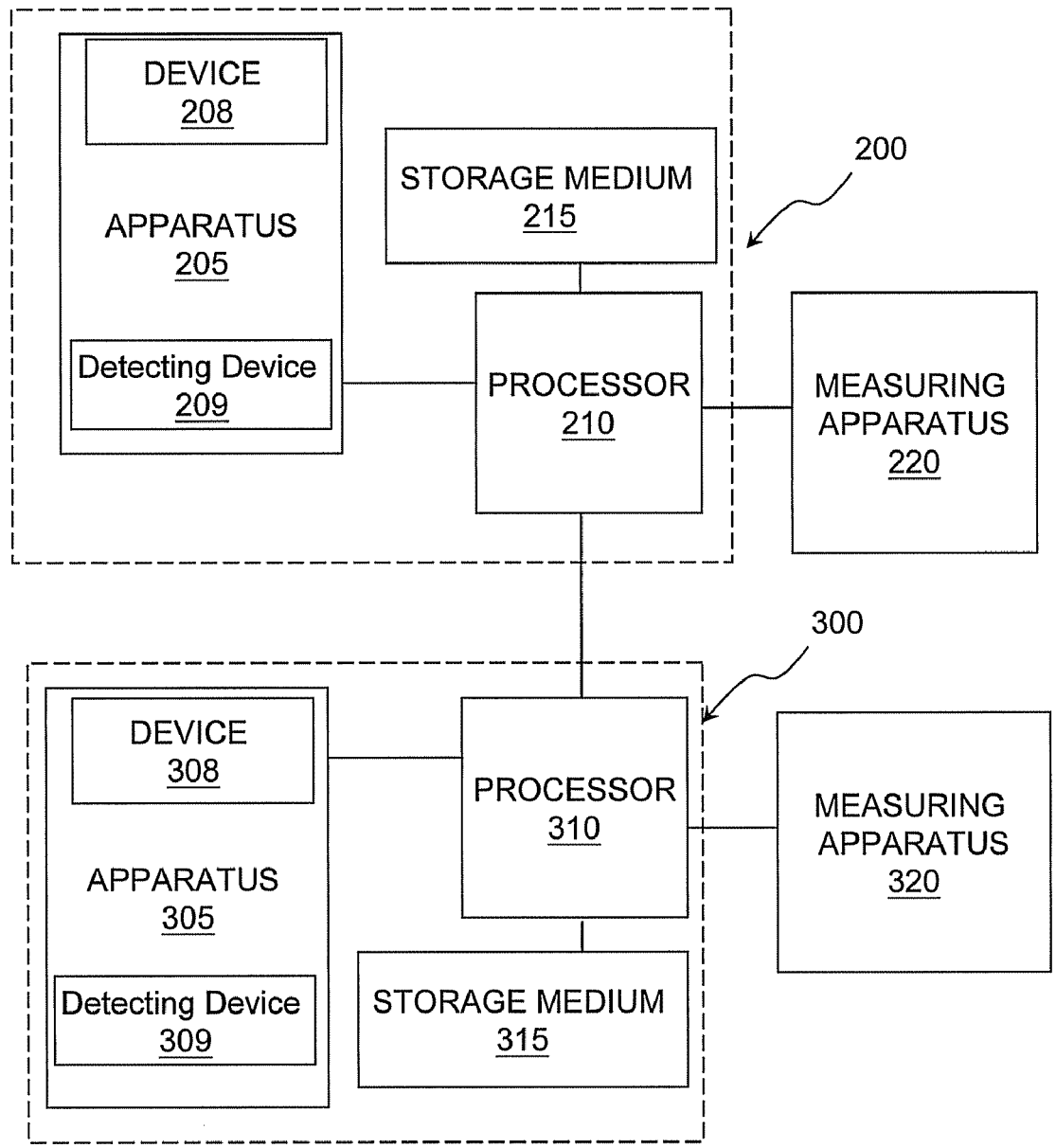
FIG. 3A is a schematic block diagram showing a processing system comprising two apparatuses.

FIG. 3A is a schematic block diagram showing a processing system comprising two of the apparatus as described above with reference to FIG. 2A.

Referring to FIG. 3A, the apparatus 305 may comprise at least one apparatus set forth above in connection with the apparatus 205 of FIG. 2A. The processor 310 may be the same as, or similar to, the processor 210. In some embodiments, the processor 210 and 310 may be coupled to each other. In still other embodiments, the processors 210 and 310 may be integrated or embedded in a single device or tool for performing functions described below. The measuring apparatus 320 may be the same as, or similar to, the measuring apparatus 220. The device 308 and the storage medium 315 are similar to the device 208 and the storage medium 215 described above, respectively. The detecting device 309 may be the same as, or similar to, the detecting device 209 described above in connection with FIG. 2A.

Figure 3B:
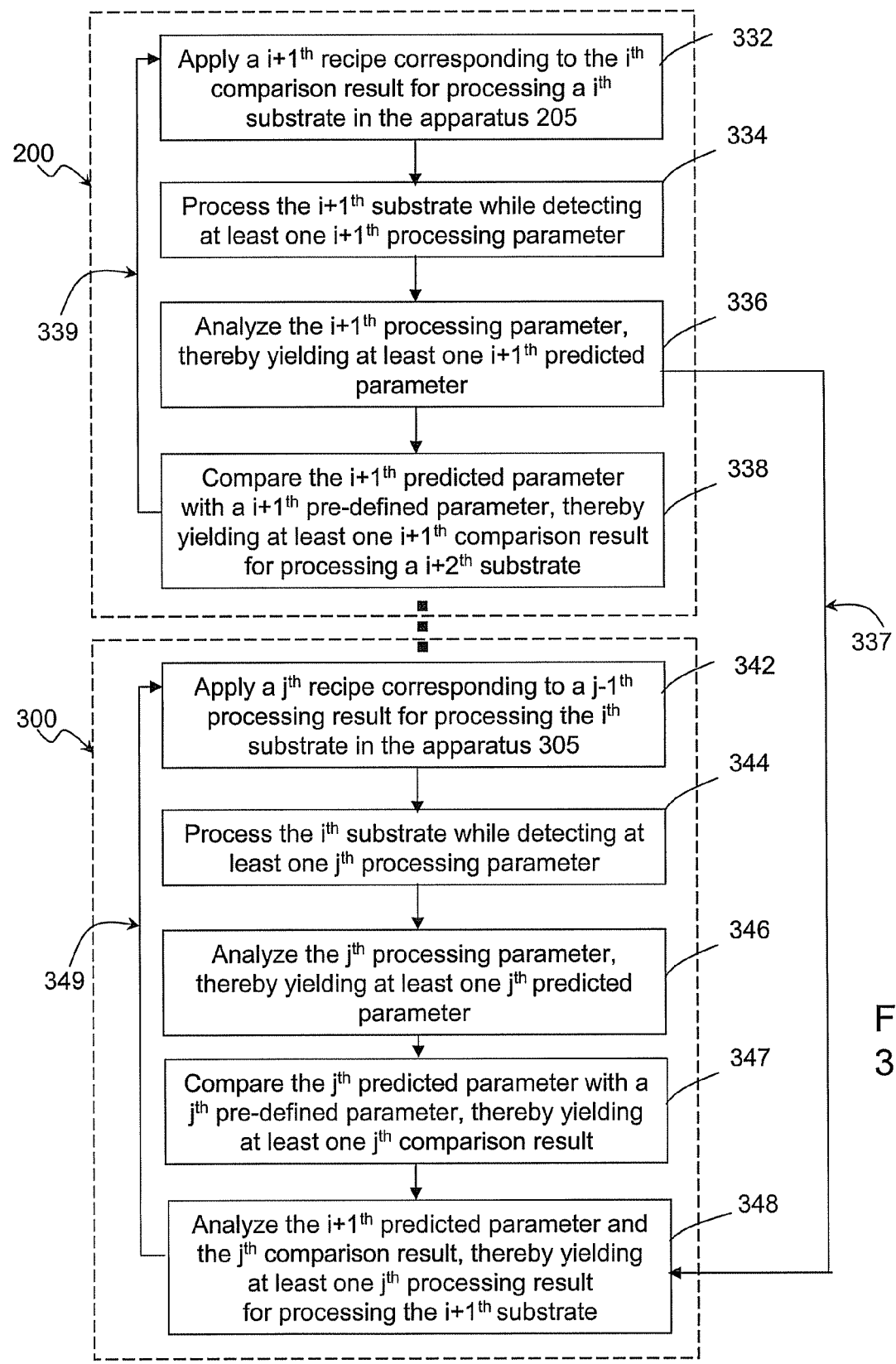
FIG. 3B is a schematic flowchart showing an exemplary method for processing the i+1$^{th}$ substrate in accordance with the i+1$^{th}$ predicted parameter value generated in the system 200 and the j$^{th}$ predicted parameter value generated in the system 300.

FIG. 3B is a schematic flow chart showing an exemplary method for processing the $i+1^{th}$ substrate in accordance with the $i+1^{th}$ predicted parameter generated in the system 200 and the $j^{th}$ predicted parameter generated in the system 300. In some embodiments, the apparatus 205 may be a CVD apparatus and the apparatus 305 may be a CMP apparatus, the apparatus 205 may be a CVD apparatus and the apparatus 305 may be an etch apparatus, the apparatus 205 may be a photolithographic apparatus and the apparatus 305 may be an etch apparatus, or the apparatuses 205 and 305 may be apparatuses which provide correlated substrate characteristics.

Referring to FIG. 3B, steps 332, 334, 336 and 338 are similar to steps 232, 234, 236 and 238 described above in connection with FIG. 2B. The difference between the processing loops shown in FIGS. 2B and 3B is that the latter includes steps for generating the i+1$^{th}$ comparison result 339 for processing the i+2$^{th}$ substrate.

After step 336, the i+1$^{th}$ predicted parameter 337 may be stored in the storage mediums 215, 315, combinations thereof or another storage medium. The processor 310 may apply the j$^{th}$ recipe for processing the i$^{th}$ substrate in step 342. Step 342 is similar to step 232 described above in connection with FIG. 2B. In step 344, the apparatus 305 may process the i$^{th}$ substrate while detecting at least one j$^{th}$ processing parameter. Step 344 is similar to step 234 described above in connection with FIG. 2B. In step 346, the processor 310 may analyze the effects of the j$^{th}$ processing parameter, thereby yielding at least one j$^{th}$ predicted parameter. Step 346 is similar to step 246 described above by reference to FIG. 2B.

In step 347, the processor 310 may compare the j$^{th}$ predicted parameter with a j$^{th}$ pre-defined parameter, thereby yielding at least one j$^{th}$ comparison result. The comparison step 347 is similar to the comparison step 238 set forth above in connection with FIG. 2B, except that the j$^{th}$ comparison result is not yet provided for processing the i+1$^{th}$ substrate.

In step 348, the processor 310 may retrieve the i+1$^{th}$ predicted parameter 337 generated in the system 200 and process the i+1$^{th}$ predicted parameter 337 and the j$^{th}$ comparison result, thereby yielding at least one j$^{th}$ processing result 349 for processing the i+1$^{th}$ substrate.

For example, the apparatus 205 may be a CVD apparatus and the apparatus 305 may be a CMP apparatus. The CVD apparatus 205 forms the i+1$^{th}$ thin film layer over the i+1$^{th}$ substrate in step 334. Step 336 then processes the processing parameters of step 334 (e.g., the distribution of processing gas, gas flow rate, processing temperature, processing pressure, power, combinations thereof or the like), thereby yielding the predicted thickness and/or its uniformity 337 of the i+1$^{th}$ substrate. The predicted thickness 337 may be stored in the storage medium 215, for example. The CMP apparatus 305 processes the i$^{th}$ substrate while detecting the j$^{th}$ processing parameter (e.g., rotational speed, the distribution of downward force, slurry, amount of slurry, combinations thereof or the like) in step 344. The processor 310 then processes the j$^{th}$ processing parameter, thereby yielding the j$^{th}$ predicted parameter (e.g., predicted removal rate or removal thickness and uniformity) in step 346. In step 347, the processor 310 may compare the j$^{th}$ predicted parameter (i.e., the predicted removal rate or removal thickness and uniformity thereof) with the j$^{th}$ pre-defined parameter (i.e., the pre-defined removal rate or removal thickness and uniformity thereof), thereby yielding the j$^{th}$ comparison result (e.g., deviation of the predicted removal rate or thickness from the pre-defined removal rate or thickness and uniformity thereof).

In step 348, the processor 310 may process the j$^{th}$ comparison result (e.g., deviation of the predicted removal rate or thickness from the pre-defined removal rate or thickness and uniformity) with the predicted thickness 337 retrieved from the system 200, thereby yielding the j$^{th}$ processing result 349 (e.g., the predicted remaining thickness and uniformity) for processing the i+1$^{th}$ substrate in the apparatus 305. The j$^{th}$ processing result 349 is then fed back to step 342 for further processing the i+1$^{th}$ substrate.

It is noted that steps 222, 224, 226 and 228 shown in FIG. 2C, steps 235 and 241-244 shown in FIG. 2D and/or steps 235a and 246-249 shown in FIG. 2E can be applied in either or both of the systems 200 and 300 to achieve a desired process flow. In addition, the devices 208 and 308 may further provide at least one desired uniform substrate characteristic (e.g., thickness, width, depth, length, diameter, thickness, resistance, sheet resistance, refractive index, dielectric constant, combination thereof or the like). With the desired uniform characteristics, dies formed at a peripheral region and a central region of a substrate may be formed with approximate electrical characteristics (e.g., resistance, current, threshold voltage or the like) that all fall within desired specifications. in response to the exemplary methods set forth above, more dies that pass acceptance criteria can be provided from the substrate. Accordingly, yields and productivity of dies are thus enhanced.

Figure 4A:
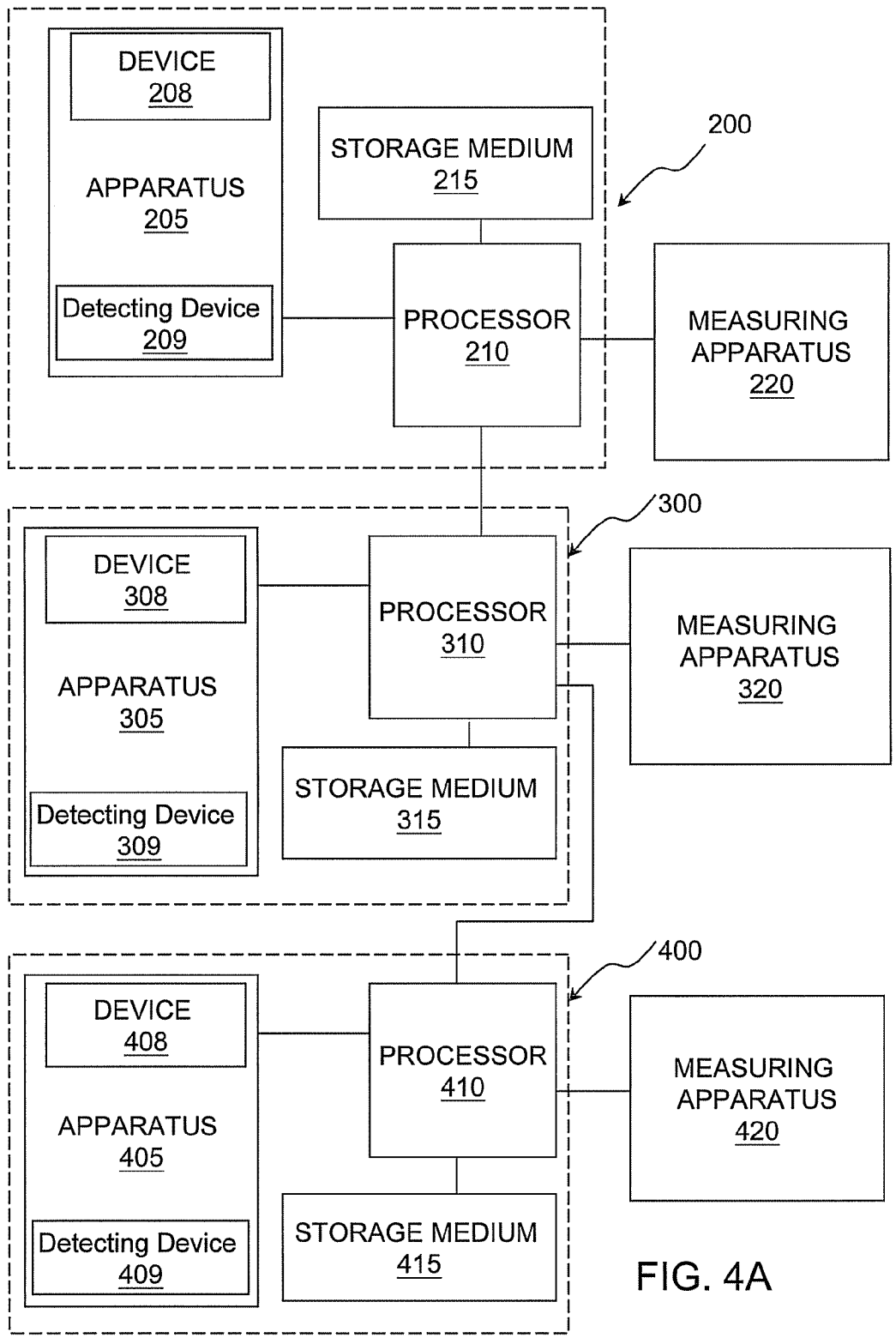
FIG. 4A is a schematic block diagram showing a processing system comprising three apparatuses.

FIG. 4A is a schematic block diagram showing a processing system comprising three apparatus.

Referring to FIG. 4A, the apparatus 405 may comprise at least one apparatus 205 as described above in connection with FIG. 2A. The processor 410 may be the same as, or similar to, the processor 410. In some embodiments, the processors 210, 310 and 410 are coupled to each other. In still other embodiments, at least two of the processors 210, 310 and 410 may be integrated or embedded in a single device or tool for performing functions described below. The measuring apparatus 420 may be the same as, or similar to, the measuring apparatus 220. The device 408 and the storage medium 415 are similar to the device 208 and the storage medium 215 described above. The detecting device 409 may be the same as, or similar to, the detecting device 209 described above in connection with FIG. 2A. The number of the apparatuses is not limited to the embodiments shown in FIGS. 2A, 3A and 4A. More than three apparatuses can be coupled and provide a desired semiconductor processing system.

Figure 4B:
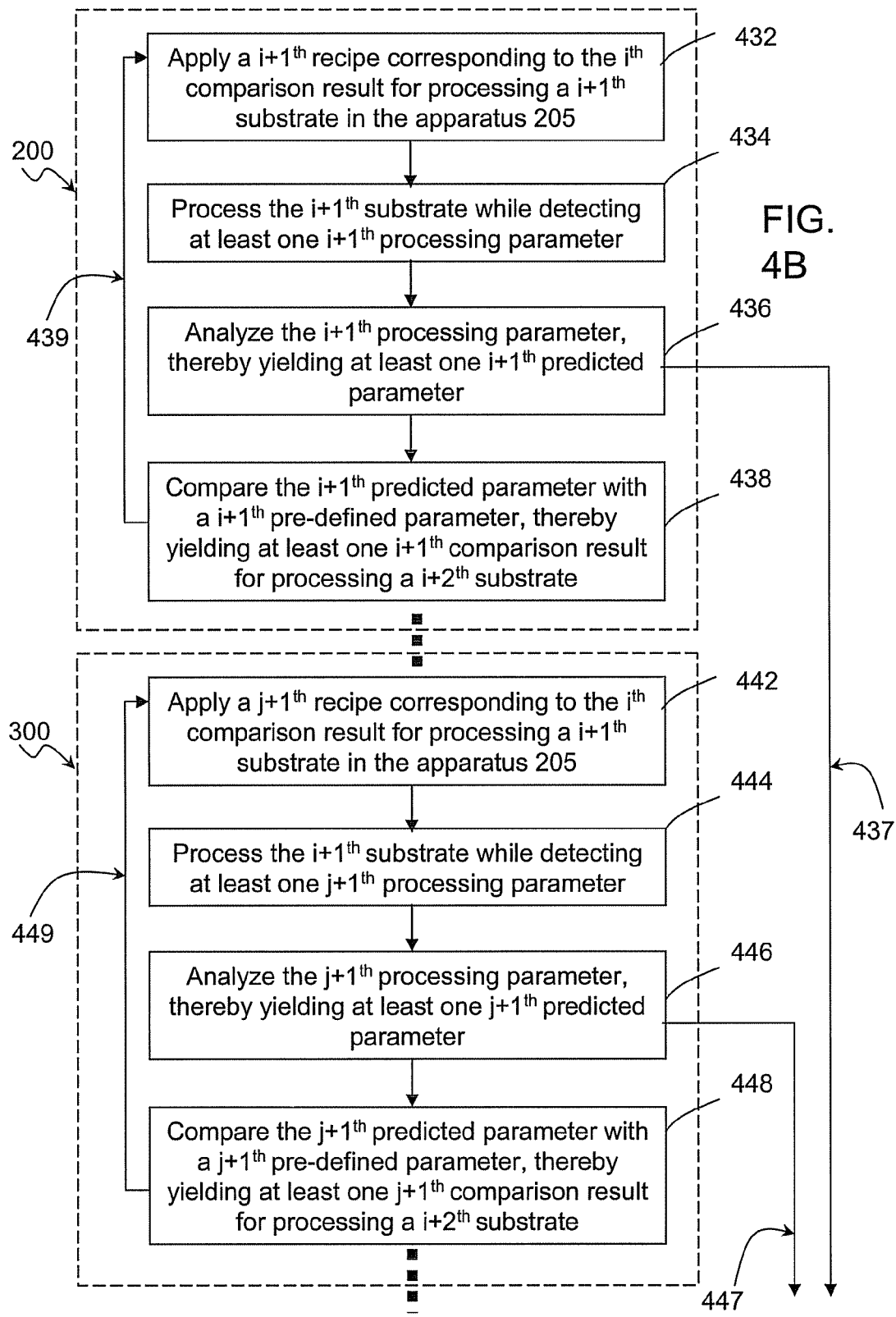
FIG. 4B is a schematic flowchart showing an exemplary method for processing the i+1$^{th}$ substrate in accordance with the i+1$^{th}$ predicted parameter value generated in the system 200, the j+1$^{th}$ predicted parameter value generated in the system 300 and the k$^{th}$ predicted parameter value generated in the system 400.
Figure 4B:
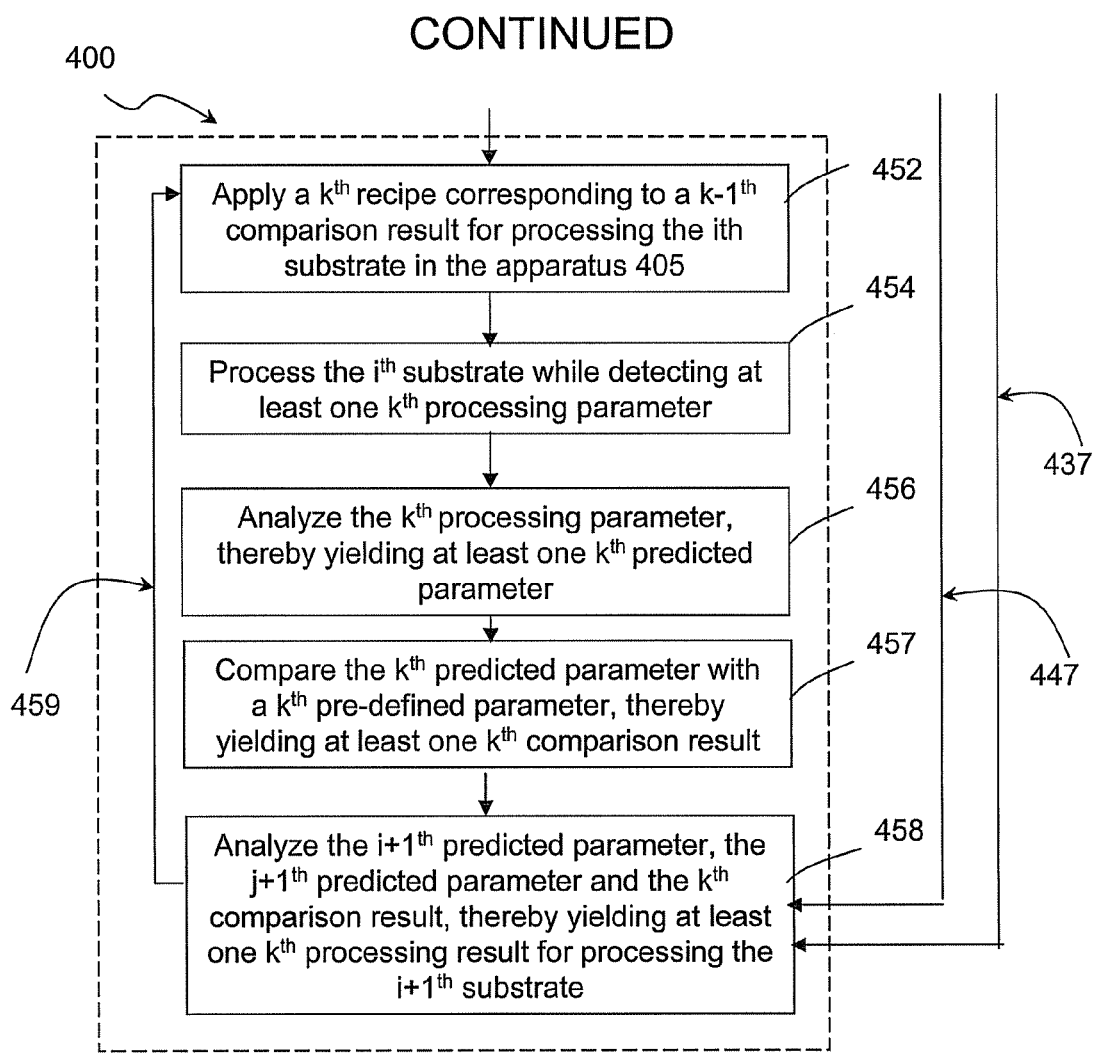

FIG. 4B is a schematic flowchart showing an exemplary method for processing the i+1$^{th}$ substrate in accordance with the i+1$^{th}$ predicted parameter generated in the system 200, the j+1$^{th}$ predicted parameter generated in the system 300 and the k$^{th}$ predicted parameter generated in the system 400. In some embodiments, the apparatus 205 may be a CVD apparatus, the apparatus 305 may be a CMP apparatus and the apparatus 405 may be an etch apparatus; the apparatus 205 may be a CVD apparatus, the apparatus 305 may be an etch apparatus and the apparatus 405 may be a metal CVD apparatus; the apparatus 205 may be a photolithographic apparatus, the apparatus 305 may be an etch apparatus and the apparatus may be a CVD apparatus; or at least two of the apparatuses 205, 305 and 405 may be apparatuses which correlatively affect at least one substrate characteristic.

Referring to FIG. 4B, steps 432, 434, 436, 438, 442, 444, 446 and 448 are similar to steps 232, 234, 236 and 238 described above in connection with FIG. 2B. The difference between the processing loops shown in FIGS. 2B and 4B is that the latter describes steps for generating the i+1$^{th}$ and j+1$^{th}$ comparison results for processing the i+1$^{th}$ substrate in the system 400. In the embodiments of FIGS. 2A and 3A, the systems 200 and 300 are not correlated, for example, and the predicted parameter generated in the system 200 is not provided to the system 300 for processing the i+1$^{th}$ substrate.

After steps 436 and 446, the i+1$^{th}$ predicted parameter 437 and the j+1$^{th}$ predicted parameter 447 may be stored in the storage medium 215, 315, 415, combinations thereof or other storage medium. The processor 410 may apply the k$^{th}$ recipe for processing the i$^{th}$ substrate in step 452. Step 452 is similar to step 232 described above in connection with FIG. 2B. In step 454, the apparatus 405 may process the i$^{th}$ substrate while detecting at least one k$^{th}$ processing parameter. Step 454 is similar to step 234 described above in connection with FIG. 2B. In step 456, the processor 410 may process the k$^{th}$ processing parameter, thereby yielding at least one k$^{th}$ predicted parameter. Step 456 is similar to step 246 described above by reference to FIG. 2B.

In step 457, the processor 410 may compare the $k^{th}$ predicted parameter with a $k^{th}$ pre-defined parameter, thereby yielding at least one $k^{th}$ comparison result. The comparison step 457 is similar to the comparison step 238 set forth above in connection with FIG. 2B, except that the $k^{th}$ comparison result is not yet provided for processing the $i+1^{th}$ substrate.

In step 458, the processor 410 may retrieve the $i+1^{th}$ predicted parameter 437 generated in the system 200 and the $j+1^{th}$ predicted parameter 447 generated in the system 300 and process the $i+1^{th}$ predicted parameter 437, the $j+1^{th}$ predicted parameter 447 and the $k^{th}$ comparison result, thereby yielding at least one $k^{th}$ processing result 459 for processing the $i+1^{th}$ substrate.

For example, the apparatus 205 may be a CVD apparatus, the apparatus 305 may be a CMP apparatus and the apparatus 405 may be an etch apparatus. In FIG. 4A, the substrate characteristic resulting from the apparatus 205, for example, does not affect the substrate characteristic resulting from the apparatus 305. Accordingly, the predicted parameter 437 generated in step 436 is not provided in the system 300 for generating a processing result.

The CVD apparatus 205 may, for example, form a thin film layer over the $i+1^{th}$ substrate in step 434. Step 436 then processes the processing parameters of step 434 (e.g., the distribution of processing gas, gas flow rate, processing temperature, processing pressure, power, combinations thereof or the like), thereby yielding the predicted thickness 437 of the $i+1^{th}$ substrate. The predicted thickness and/or its uniformity 437 may be stored in the storage medium 215, for example. The CMP apparatus 305 may, for example process the $i+1^{th}$ substrate in step 444 with the $j+1^{th}$ processing parameter (e.g., rotational speed, the distribution of downward force, slurry, amount of slurry, combinations thereof or the like). The processor 310 would then process the $j+1^{th}$ processing parameter, thereby yielding the $j+1^{th}$ predicted parameter 447 (e.g., predicted removal rate or removal thickness and/or its uniformity). The predicted removal rate and removal thickness and removal uniformity may be stored, for example, in the storage medium 315.

In system 400, the etch apparatus 405 may remove portions of the thin film layer, corresponding to a patterned photoresist layer (not shown) formed over the thin film layer, to form a via/contact hole, damascene trench, damascene hole or the like, for example,. In step 452, the processor 410 may apply the $k^{th}$ recipe to the etch apparatus 405 for processing the $i^{th}$ substrate. The etch apparatus 405 then process the $i^{th}$ substrate while detecting at least one $k^{th}$ processing parameter by the detecting device 409 (shown in FIG. 4A) in step 454. In step 456, the processor 410 may then process the $k^{th}$ processing parameter, thereby yielding at least one $k^{th}$ predicted parameter (e.g., predicted etch rate or etch thickness, i.e., etch depth and uniformities thereof).

In step 457, the processor 410 may compare the $k^{th}$ predicted parameter (i.e., predicted etch rate or etch thickness, i.e., etch depth, and uniformities thereof) with the $k^{th}$ pre-defined parameter (i.e., the pre-defined predicted etch rate or etch thickness and uniformities thereof), thereby yielding the $k^{th}$ comparison result (e.g., deviation of the predicted etch rate or etch thickness and their uniformities from the pre-defined etch rate or etch thickness and uniformity thereof).

In step 458, the processor 410 may process the $k^{th}$ comparison result (e.g., deviation of the predicted etch rate or etch thickness and/or its uniformity from the pre-defined etch rate or etch thickness and/or its uniformity) with the predicted thickness 437 retrieved from the system 200 and the predicted removal rate or removal thickness, i.e., etch depth, and/or its uniformity 447 retrieved from the system 300, thereby yielding the $k^{th}$ processing result 459 (e.g., the predicted depth) for processing the $i+1^{th}$ substrate in the apparatus 405. The $k^{th}$ processing result 459 is then fed back to step 452 for further processing the $i+1^{th}$ substrate.

For some embodiments, steps 222, 223, 224, 226 and 228 shown in FIG. 2C, steps 235 and 241-244a shown in FIG. 2D and/or steps 235a and 246-249a and 249c shown in FIG. 2E can be applied in either or both of the systems 200 and 300 to achieve a desired process flow. In addition, the devices 208, 308 and/or 408 may further provide at least one desired uniform substrate characteristic (e.g., the uniformity of thickness, width, depth, length, diameter, thickness, resistance, sheet resistance, refractive index, dielectric constant, combination thereof or the like). With the desired uniform characteristics, dies may be formed, at the peripheral region and central region, with approximate electrical characteristics (e.g., the uniformity of resistance, current, threshold voltage or the like) that all fall within desired specifications. Accordingly, yields and productivity of dies are thus enhanced.

Figure 4C:
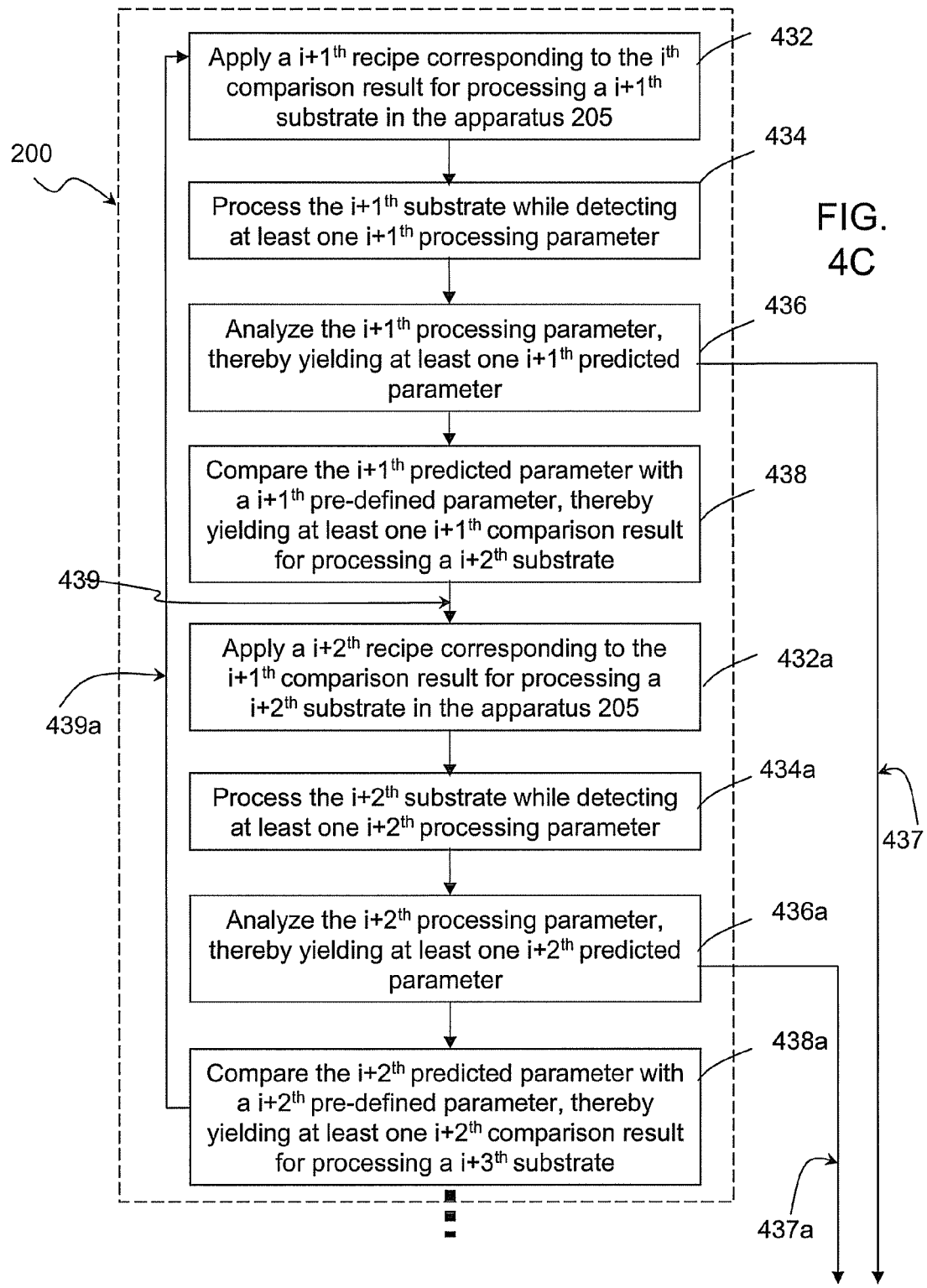
FIG. 4C is a schematic flowchart showing another exemplary method for processing the i+1$^{th}$ substrate in accordance with the i+1$^{th}$ predicted parameter value generated in the system 200, the j+1$^{th}$ predicted parameter value generated in the system 300 and the k$^{th}$ predicted parameter value generated in the system 400.
Figure 4C:
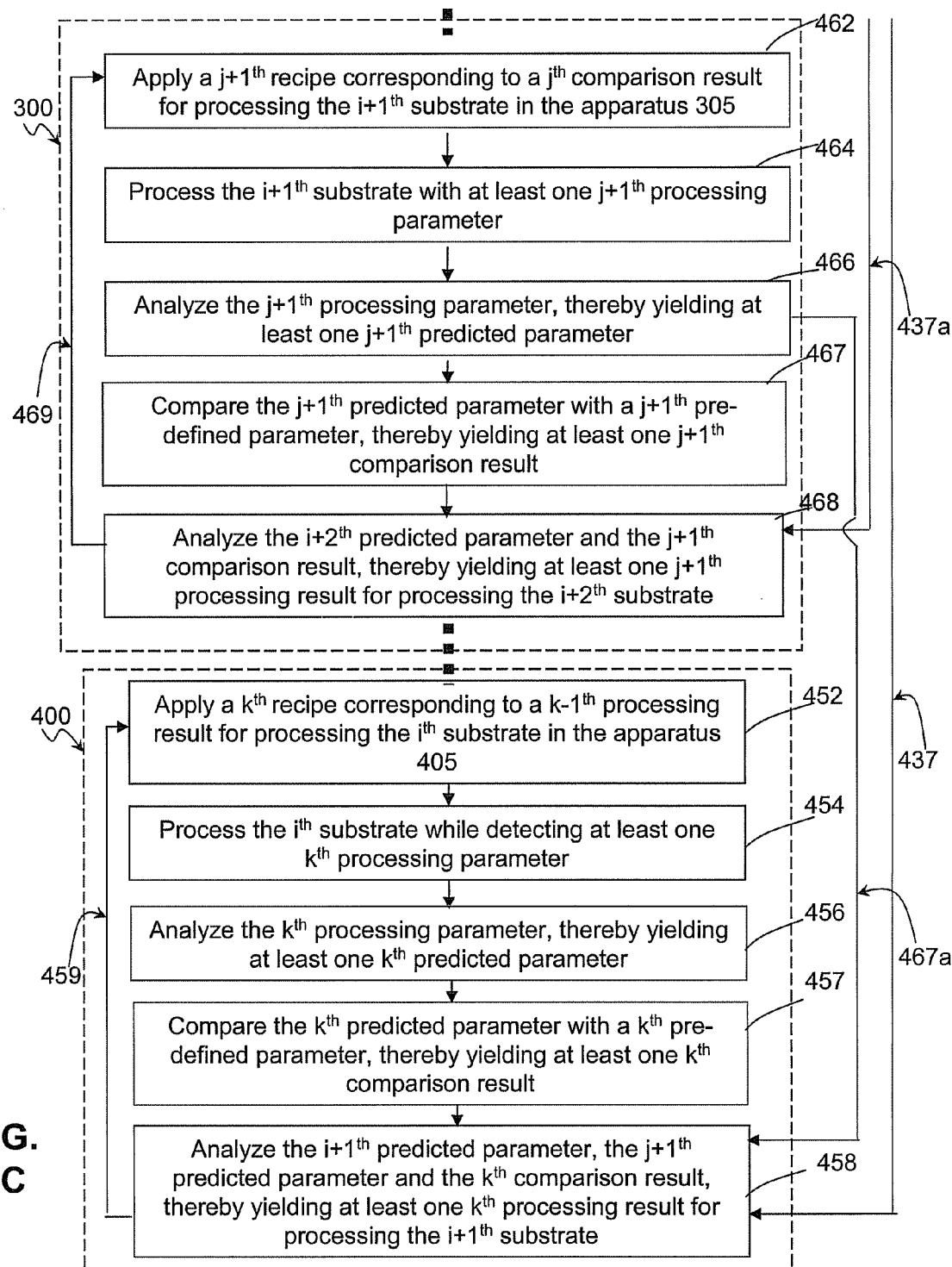

FIG. 4C is a schematic flowchart showing an exemplary method for processing the $i+1^{th}$ substrate in accordance with the $i+1^{th}$ predicted parameter 437 generated in the system 200, the $j+1^{th}$ predicted parameter 467a generated in the system 300 and the $k^{th}$ predicted parameter generated in the system 400. In FIG. 4C, substrate characteristics generated in the systems 200 and 300 are correlated. Steps 432a, 434a, 436a and 438a are similar to steps 432, 434, 436 and 438, respectively. Steps 432a, 434a, 436a and 438a are provided to generate the $i+2^{th}$ comparison result 439a for processing the $i+3^{th}$ substrate, and steps 432, 434, 436 and 438 are provided to generate the $i+1^{th}$ comparison result 439 for processing the $i+2^{th}$ substrate. In other words, the processing loop in the system 200 shown in FIG. 4C is an expanded processing loop of FIG. 2B to better show that the $i+1^{th}$ predicted parameter 437 is provided to step 458 for generating the $k^{th}$ processing result and that the $i+2^{th}$ predicted parameter 437a is provided to step 468 for generating the $j+1^{th}$ processing result. Steps 462, 464, 466, 467 and 468 are similar to steps 342, 344, 346, 347 and 348 described above in connection with FIG. 3B.

The present invention may be embodied in the form of computer-implemented processes and apparatus for practicing those processes. The present invention may also be embodied in the form of computer program code embodied in tangible media, such as floppy diskettes, read only memories (ROMs), CD-ROMs, hard drives, "ZIP™" high density disk drives, flash memory drives, or any other computer-readable storage medium, wherein, when the computer program code is loaded into and executed by a computer, the computer becomes an apparatus for practicing the invention. The present invention may also be embodied in the form of computer program code, for example, whether stored in a storage medium, loaded into and/or executed by a computer, or transmitted over some transmission medium, such as over the electrical wiring or cabling, through fiber optics, or via electromagnetic radiation, wherein, when the computer program code is loaded into and executed by a computer, the computer becomes an apparatus for practicing the invention. When implemented on a general-purpose processor, the computer program code segments configure the processor to create specific logic circuits.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

The invention claimed is:

1. A semiconductor processing method, comprising:
processing a first substrate while detecting at least one value of a first processing parameter in a first apparatus;
analyzing the first processing parameter, thereby yielding at least one first predicted parameter value;
comparing the first predicted parameter value with a first pre-defined parameter value, thereby yielding at least one first comparison result;
applying a first recipe corresponding to the first comparison result for processing a second substrate in the first apparatus with at least one second processing parameter value corresponding to the first recipe;
analyzing the second processing parameter value, thereby yielding at least one second predicted parameter value; and
determining whether a processing time of the first apparatus is longer than, or equal to, a pre-defined processing time, and
wherein if the processing time of the first apparatus is longer than, or equal to the pre-defined processing time, the method further comprises;
measuring the second substrate, thereby yielding at least one first measurement parameter value;
comparing the first measurement parameter with the second pre-defined parameter, thereby yielding at least one third comparison result.

2. The semiconductor processing method of claim 1, wherein the first processing parameter comprises at least one of a processing temperature, a type of a gas, a flow rate of the gas, a pressure, a processing time, a voltage, a current, a radio frequency (RF) power, a power, an implantation energy, an implantation dosage, a photolithographic exposure energy, a photolithographic exposure time, a photoresist spin rate, a chemical mechanical planarization (CMP) rotation rate, and a CMP downward force.

3. The semiconductor processing method of claim 1, wherein the first predicted parameter value comprises at least one of a thickness, a width, a depth, a length, a diameter, a thickness, a resistance, a sheet resistance, a refractive index, a dielectric constant, a uniformity, a hardness, an elasticity, an area, and a space.

4. The semiconductor processing method of claim 1 further comprising:
processing a third substrate while detecting at least one second processing parameter immediately after a preventive maintenance (PM) step and before processing the first substrate;
measuring the third substrate, thereby yielding at least one first measurement parameter value;
comparing the first measurement parameter value and a second pre-defined parameter value, thereby yielding at least one second comparison result; and
applying a second recipe corresponding to the second comparison result for processing the first substrate.

5. The semiconductor processing method of claim 1 further comprising:
processing the second substrate while detecting at least one second processing parameter value corresponding to the first recipe; and
determining whether a numeral associated with the second substrate is equal to a pre-defined number, wherein the numeral indicates a number of substrates processed since a preventive maintenance operation or an amount of time since the preventive maintenance operation,
wherein if the numeral is not equal to the pre-defined number, the method further comprises:
comparing the second predicted parameter value with at least one second pre-defined parameter value, thereby yielding at least one second comparison result for processing a third substrate, and
wherein if the numeral is equal to the pre-defined number, the method further comprises:
measuring the second substrate, thereby yielding at least one first measurement parameter value;
wherein if the third comparison result is not larger than, or equal to, about a pre-defined percentage of at least one of the first measurement parameter and the second predicted parameter value, the method further comprises:
applying a second recipe corresponding to the third comparison result for processing a third substrate in the first apparatus, and
wherein if the third comparison result is about the pre-defined percentage or more of at least one of the first measurement parameter and the second predicted parameter value, the method further comprises:
modifying a simulation software for yielding a modified predicted parameter value;
comparing the modified predicted parameter value with at least one third pre-defined parameter value, thereby yielding a fourth comparison result; and
applying a third recipe corresponding to the fourth comparison result for processing the third substrate in the first apparatus.

6. The semiconductor processing method of claim 1, wherein if the processing time of the first apparatus is not longer than, or equal to the pre-defined processing time, the method further comprises:
comparing the second predicted parameter value with at least one second pre-defined parameter value, thereby yielding at least one second comparison result for processing a third substrate, and
wherein if the third comparison result is not larger than, or equal to, about a pre-defined percentage of at least one of the first measurement parameter and the second predicted parameter value, the method further comprises:
applying a second recipe corresponding to the third comparison result for processing a third substrate in the first apparatus, and
wherein if the third comparison result is about the pre-defined percentage or more of at least one of the first measurement parameter and the second predicted parameter value, the method further comprises:
modifying a simulation software for yielding a modified predicted parameter value;
comparing the modified predicted parameter value with at least one third pre-defined parameter value, thereby yielding a fourth comparison result; and
applying a third recipe corresponding to the fourth comparison result for processing the third substrate in the first apparatus.

7. The semiconductor processing method of claim 1, wherein the applying step comprises selecting the first recipe from a recipe selection table (RST).

8. The semiconductor processing method of claim 1, wherein the first recipe is applied to provide at least one approximately uniform characteristic of the second substrate.

9. The semiconductor processing method of claim 1 further comprising:
processing the first substrate while detecting at least one third processing parameter value in a second apparatus;

analyzing the third processing parameter, thereby yielding at least one third predicted parameter value;

comparing the third predicted parameter value with at least one second pre-defined parameter value, thereby yielding at least one second comparison result;

analyzing the second comparison result and the second predicted parameter value and the second comparison result, thereby yielding at least one first processing result; and applying a second recipe corresponding to the first processing result for processing the second substrate in the second apparatus.

10. The semiconductor processing method of claim 9 further comprising:

processing the second substrate with at least one fourth processing parameter value corresponding to the second recipe in the second apparatus;

analyzing the fourth processing parameter, thereby yielding at least one fourth predicted parameter value;

processing the first substrate with at least one fifth processing parameter value in a third apparatus;

analyzing the fifth processing parameter, thereby yielding at least one fifth predicted parameter value;

comparing the fifth predicted parameter value with at least one third pre-defined parameter value, thereby yielding at least one third comparison result;

analyzing the second predicted parameter value, the fourth predicted parameter value and the third comparison result, thereby yielding at least one second processing result; and applying a third recipe corresponding to the second processing result for processing the second substrate in the third apparatus.

11. A semiconductor processing method, comprising:

processing a first substrate while detecting a first processing parameter value of at least one first processing parameter in a first apparatus;

analyzing the first processing parameter, thereby yielding at least one first predicted parameter value;

comparing the first predicted parameter value with a first pre-defined parameter value, thereby yielding at least one first comparison result; and applying a first recipe corresponding to the first comparison result for processing a second substrate while detecting at least one second processing parameter value in the first apparatus;

analyzing the second processing parameter, thereby yielding at least one second predicted parameter value;

processing the first substrate while detecting a third processing parameter value of at least one third processing parameter in a second apparatus;

analyzing the third processing parameter, thereby yielding at least one third predicted parameter value;

analyzing the second predicted parameter value and the third predicted parameter value, thereby yielding at least one first processing result; and comparing the first processing result with at least one second pre-defined parameter, thereby yielding at least one second comparison result;

applying a second recipe corresponding to the second comparison result for processing the second substrate in the second apparatus, wherein at least one of the first recipe and the second recipe is applied to provide at least one approximately uniform characteristic of the second substrate determining whether a numeral associated with the second substrate is equal to a pre-defined number, wherein the numeral indicates a number of substrates processed since a preventive maintenance operation or an amount of time since the preventive maintenance operation;

wherein if the numeral is not equal to the pre-defined number, the method further comprises;

comparing the fourth predicted parameter value with the at least one third ore-defined parameter value, thereby yielding at least one third comparison result for processing a third substrate, and wherein if the numeral is equal to the pre-defined number, the method further comprises:

measuring the second substrate, thereby yielding at least one second measurement parameter value;

comparing the second measurement parameter with at least one third pre-defined parameter, thereby yielding at least one fourth comparison result, wherein if the fourth comparison result is about a pre-defined percentage or more of at least one of the second measurement parameter and the fourth predicted parameter value, the method further comprises:

modifying a simulation software for yielding a modified predicted parameter value;

comparing the modified predicted parameter value with at least one fourth pre-defined parameter value, thereby yielding a fifth comparison result;and applying a fourth recipe corresponding to the fifth comparison result for processing the fourth substrate.

12. The semiconductor processing method of claim 11, wherein the first processing parameter value comprises at least one of a processing temperature, a type of a gas, a flow rate of the gas, a pressure, a processing time, a voltage, a current, a radio frequency (RF) power, a power, an implantation energy, an implantation dosage, a photolithographic exposure energy, a photolithographic exposure time, a photoresist spin rate, a chemical mechanical planarization (CMP) rotation rate, and a CMP downward force.

13. The semiconductor processing method of claim 11, wherein the first predicted parameter value comprises at least one of a thickness, a width, a depth, a length, a diameter, a thickness, a resistance, a sheet resistance, a refractive index, a dielectric constant, a uniformity, a hardness, an elasticity, an area, and a space.

14. The semiconductor processing method of claim 11 further comprising:

processing at least one third substrate while detecting at least one fourth processing parameter value immediately after a preventive maintenance (PM) step of the first apparatus and before processing the first substrate;

measuring the third substrate, thereby yielding at least one first measurement parameter value;

comparing the first measurement parameter value and a second pre-defined parameter value, thereby yielding at least one second comparison result; and applying a third recipe corresponding to the second comparison result for processing the first substrate.

15. The semiconductor processing method of claim 11 further comprising:

processing the second substrate while detecting at least one fourth processing parameter value corresponding to the second recipe;

analyzing the fourth processing parameter value, thereby yielding at least one fourth predicted parameter value; and wherein if the third comparison result is not larger than, or equal to, about the pre-defined percentage of at least one of the second measurement parameter and the fourth predicted parameter value, the method further comprises: and
applying a third recipe corresponding to the fourth comparison result for processing a fourth substrate.

16. The semiconductor processing method of claim 11 further comprising:
processing the second substrate with at least one fourth processing parameter value corresponding to the second recipe;
determining whether a processing time of the first apparatus is longer than, or equal to, a pre-defined processing time,
wherein if the processing time of the first apparatus is not longer than, or equal to the pre-defined processing time, the method further comprises:
comparing the fourth predicted parameter value with at least one third pre-defined parameter value, thereby yielding at least one third comparison result for processing a third substrate, and
wherein if the processing time of the first apparatus is longer than or equal to the pre-defined processing time, the method further comprises:
measuring the second substrate, thereby yielding at least one first measurement parameter value;
comparing the first measurement parameter with the third pre-defined parameter, thereby yielding at least one fourth comparison result,
wherein if the third comparison result is not larger than, or equal to, about a pre-defined percentage of at least one of the second measurement parameter and the fourth predicted parameter value, the method further comprises:
applying a third recipe corresponding to the fourth comparison result for processing a fourth substrate.

17. The semiconductor processing method of claim 11, wherein at least one of the applying steps comprises selecting the first recipe or the second recipe from at least one recipe selection table (RST).

18. The semiconductor processing method of claim 11 further comprising:
processing the second substrate with at least one fourth processing parameter value corresponding to the second recipe in the second apparatus;
analyzing the fourth processing parameter, thereby yielding at least one fourth predicted parameter value;
processing the first substrate with at least one fifth processing parameter value in a third apparatus;
analyzing the fifth processing parameter, thereby yielding at least one fifth predicted parameter value;
comparing fifth predicted parameter value with at least one third pre-defined parameter value, thereby yielding at least one third comparison result;
analyzing the second predicted parameter value, the fourth predicted parameter value and the third comparison result, thereby yielding at least one second processing result; and
applying a third recipe corresponding to the second processing result for processing the second substrate in the third apparatus.

19. A semiconductor processing system, comprising:
a first apparatus, wherein the first apparatus is configured to process a first substrate with at least one first processing parameter; and
at least one first processor coupled to the first apparatus, wherein the first processor is configured to analyze the first processing parameter, thereby yielding at least one first predicted parameter value; to compare the first predicted parameter value with a first pre-defined parameter value, thereby yielding at least one first comparison result; and to control the first apparatus for modifying a simulation software for yielding a modified predicted parameter value, comparing the modified predicted parameter value with the first pre-defined parameter value, thereby yielding a second comparison result, and applying a recipe corresponding to the second comparison result for processing a second substrate.

20. The semiconductor processing system of claim 19, wherein the first processing parameter comprises at least one of a processing temperature, a type of a gas, a flow rate of the gas, a pressure, a processing time, a voltage, a current, a radio frequency (RF) power, a power, an implantation energy, an implantation dosage, a photolithographic exposure energy, a photolithographic exposure time, a photoresist spin rate, a chemical mechanical planarization (CMP) rotation rate, and a CMP downward force.

21. The semiconductor processing system of claim 19, wherein the first predicted parameter comprises at least one of a thickness, a width, a depth, a length, a diameter, a thickness, a resistance, a sheet resistance, a refractive index, a dielectric constant, a uniformity, a hardness, an elasticity, an area, and a space.

22. The semiconductor processing system of claim 19 further comprising a firs measuring apparatus,
wherein the first apparatus is further configured to process a third substrate with at least one second processing parameter immediately after a preventive maintenance (PM) step and before processing the first substrate,
wherein the first measuring apparatus measures the third substrate, thereby yielding at least one first measurement parameter value, and
wherein the first processor is further configured to compare the first measurement parameter value and a second pre-defined parameter value, thereby yielding at least one second comparison result; and to apply a second recipe corresponding to the second comparison result for processing the first substrate.

23. The semiconductor processing system of claim 19, wherein the first processor is further configured to determine whether a numeral associated with the second substrate is equal to a pre-defined number, wherein the numeral indicates a number of substrate processed since a preventive maintenance operation or an amount of time since the preventive maintenance operation.

24. The semiconductor processing system of claim 19, wherein the first processor is further configured to determine whether a processing time of the first apparatus is longer than, or equal to, a pre-defined processing time.

25. The semiconductor processing system of claim 19 further comprising at least one memory storing a recipe selection table (RST) coupled to the first processor, wherein the first recipe is selected from the RST.

26. The semiconductor processing system of claim 19, wherein the first apparatus comprises a device capable of providing at least one processing condition over the second substrate corresponding to the first recipe so as to achieve at least one approximately uniform characteristic of the second substrate.

27. The semiconductor processing system of claim 19 further comprising:
a second apparatus; and
at least one second processor coupled to the second apparatus and the first processor, wherein the first apparatus is further configured to process the second substrate while detecting at least one second processing parameter value corresponding to the first recipe in the first apparatus, wherein the first processor is further configured to analyze the second processing parameter, thereby yielding at least one second predicted parameter value, wherein the second apparatus is configured to process the first substrate while detecting at least one third processing parameter value, and wherein at least one of the first processor and the second processor is configured to analyze the third processing parameter, thereby yielding at least one third predicted parameter value, to compare the third predicted parameter value with at least one second pre-defined parameter value, thereby yielding at least one second comparison result; to analyze the second comparison result and the second predicted parameter value and the second comparison result, thereby yielding at least one first processing result; and to apply a second recipe corresponding to the first processing result for processing the second substrate in the second apparatus.

28. The semiconductor processing system of claim 27 further comprising:

a third apparatus; and at least one third processor coupled to the third apparatus, the first processor and the second processor, wherein the second apparatus is further configured to process the second substrate while detecting at least one fourth processing parameter value corresponding to the second recipe, wherein at least one of the first and the second processor is further configured to analyze the fourth processing parameter, thereby yielding at least one fourth predicted parameter value, wherein the third apparatus is configured to process the first substrate while detecting at least one fifth processing parameter value, wherein the at least one of the first processor, the second processor and the third processor is configured to analyze the fifth processing parameter, thereby yielding at least one fifth predicted parameter value; to compare the fifth predicted parameter value with at least one third pre-defined parameter value, thereby yielding at least one third comparison result; to analyze the second predicted parameter value, the fourth predicted parameter value and the third comparison result, thereby yielding at least one second processing result; and to apply a third recipe corresponding to the second processing result for processing the second substrate in the third apparatus.

29. A semiconductor processing method, comprising:

processing a first substrate using a first recipe while detecting at least one value of a first processing parameter in a first apparatus;

analyzing the first processing parameter, thereby yielding at least one first predicted parameter value;

comparing the first predicted parameter value with a first pre-defined parameter value, thereby yielding at least one first comparison result; and modifying a simulation software for yielding a modified predicted parameter value;

comparing the modified predicted parameter value with the first pre-defined parameter value, thereby yielding a second comparison result; and applying a second recipe corresponding to the second comparison result for processing a second substrate.

* * * * *

UNITED STATES PATENT AND TRADEMARK OFFICE
CERTIFICATE OF CORRECTION

PATENT NO. : 7,642,100 B2
APPLICATION NO. : 11/559781
DATED : January 5, 2010
INVENTOR(S) : Chen-Hua Yu et al.

It is certified that error appears in the above-identified patent and that said Letters Patent is hereby corrected as shown below:

Column 15, Claim 1, line 22, after "comprises", replace ";" with -- : --.

Column 20, Claim 22, line 27, replace "firs" with -- first --.

Signed and Sealed this

Twenty-third Day of March, 2010

David J. Kappos
*Director of the United States Patent and Trademark Office*